United States Patent
Isa et al.

(10) Patent No.: US 12,266,957 B2
(45) Date of Patent: Apr. 1, 2025

(54) PROTECTION CIRCUIT FOR SECONDARY BATTERY AND ABNORMALITY DETECTION SYSTEM OF SECONDARY BATTERY

(71) Applicant: SEMICONDUCTOR ENERGY LABORATORY CO., LTD., Atsugi (JP)

(72) Inventors: Toshiyuki Isa, Kanagawa (JP); Takayuki Ikeda, Kanagawa (JP); Kei Takahashi, Kanagawa (JP); Ryota Tajima, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 377 days.

(21) Appl. No.: 17/431,302

(22) PCT Filed: Feb. 11, 2020

(86) PCT No.: PCT/IB2020/051042
§ 371 (c)(1),
(2) Date: Aug. 16, 2021

(87) PCT Pub. No.: WO2020/174299
PCT Pub. Date: Sep. 3, 2020

(65) Prior Publication Data
US 2022/0131392 A1    Apr. 28, 2022

(30) Foreign Application Priority Data

Feb. 25, 2019 (JP) ................................ 2019-031868
Apr. 2, 2019 (JP) ................................ 2019-070562

(51) Int. Cl.
*H02J 7/00* (2006.01)
*G01R 31/367* (2019.01)
(Continued)

(52) U.S. Cl.
CPC .......... *H02J 7/0031* (2013.01); *G01R 31/367* (2019.01); *H01L 27/0266* (2013.01); *H01M 10/48* (2013.01); *G01R 31/382* (2019.01)

(58) Field of Classification Search
CPC ................. H02J 7/0031; H02J 7/00304; H02J 7/00308; H02J 7/0048; G01R 31/367;
(Continued)

(56) References Cited

U.S. PATENT DOCUMENTS 5,963,019 A * 10/1999 Cheon ..................... H02H 7/18
                                                320/134
7,535,199 B2 * 5/2009 Kimura ................ H02J 7/0014
                                                320/120

(Continued)

FOREIGN PATENT DOCUMENTS

CA    2806976 C  *  7/2018  .......... A61C 1/0015
CN    103091636 A     5/2013
(Continued)

OTHER PUBLICATIONS

Machine Translation for JP2012065392A, "Yano KOICHI,Mar. 29, 2012, Secondary Battery Protection Circuit, Semiconductor Device, and Electronic Appliance, All" (Year: 2012).*

(Continued)

*Primary Examiner* — M Baye Diao
(74) *Attorney, Agent, or Firm* — Fish & Richardson P.C.

(57) ABSTRACT

The safety is ensured in such a manner that an abnormality of a secondary battery is detected, for example, a phenomenon that lowers the safety of the secondary battery is detected early and a warning is given to a user. A first protection circuit and a second protection circuit are provided for one secondary battery. The first protection circuit includes a memory circuit including a transistor including an oxide semiconductor. Combination of a plurality of protec- (Continued)

tion circuits enables a complementary double protection system in charging, and the safety can be further enhanced.

6 Claims, 18 Drawing Sheets

(51) Int. Cl.
  *G01R 31/382* (2019.01)
  *H01L 27/02* (2006.01)
  *H01M 10/48* (2006.01)

(58) Field of Classification Search
  CPC .............. G01R 31/382; H01L 27/0266; H01L 21/822; H01L 21/8234; H01L 21/8238; H01L 27/04; H01L 27/088; H01L 27/092; H01L 29/786; H01M 10/48; H01M 10/42; Y02E 60/10; H02H 7/18
  USPC ......................................................... 320/134
  See application file for complete search history.

(56) References Cited

U.S. PATENT DOCUMENTS

| | | | | |
|---|---|---|---|---|
| 8,093,862 B2* | 1/2012 | Mariels | ................. | H02J 7/0016 320/119 |
| 8,269,463 B2* | 9/2012 | Nakashima | ............ | B60L 3/0046 320/132 |
| 8,610,405 B2 | 12/2013 | Yamazaki et al. | | |
| 8,659,957 B2 | 2/2014 | Sekine | | |
| 8,749,204 B2* | 6/2014 | Majima | ................. | H01M 10/48 324/426 |
| 8,760,903 B2* | 6/2014 | Fujita | ................. | G11C 14/0054 365/65 |
| 9,355,687 B2* | 5/2016 | Fujita | ................. | G11C 14/0054 |
| 9,873,393 B2* | 1/2018 | Nishijima | ............ | H02J 7/1423 |
| 10,547,182 B2* | 1/2020 | Takano | ................. | H02P 29/027 |
| 10,553,851 B2* | 2/2020 | Kim | .................... | H01M 10/425 |
| 11,165,263 B2* | 11/2021 | Sung | ......................... | H02J 7/00 |
| 11,563,238 B2* | 1/2023 | Tajima | .................... | B60L 58/21 |
| 2008/0012529 A1* | 1/2008 | Chang | ................. | H02J 7/0016 320/116 |
| 2009/0058365 A1* | 3/2009 | Goto | ................... | H01M 10/486 320/134 |
| 2009/0208821 A1* | 8/2009 | Kosugi | ................. | H02J 7/0047 429/93 |
| 2009/0213511 A1* | 8/2009 | Yoshikawa | ......... | H02J 7/00302 361/91.1 |
| 2011/0187329 A1 | 8/2011 | Majima et al. | | |
| 2011/0254559 A1* | 10/2011 | Nakashima | ........... | B60L 3/0046 320/135 |
| 2012/0200968 A1* | 8/2012 | Altemose | ........... | G01R 31/2827 361/86 |
| 2012/0230114 A1 | 9/2012 | Sekine | | |
| 2013/0265010 A1 | 10/2013 | Nomura et al. | | |
| 2016/0054389 A1* | 2/2016 | Koba | ..................... | G01R 31/52 324/426 |
| 2016/0090052 A1* | 3/2016 | Nishijima | ............... | B60L 58/20 307/9.1 |
| 2021/0126473 A1 | 4/2021 | Ikeda et al. | | |
| 2021/0384751 A1 | 12/2021 | Takahashi et al. | | |
| 2021/0391604 A1 | 12/2021 | Matsuzaki et al. | | |
| 2022/0006309 A1 | 1/2022 | Takahashi et al. | | |
| 2022/0011375 A1 | 1/2022 | Takahashi et al. | | |
| 2022/0021376 A1 | 1/2022 | Okamoto et al. | | |
| 2022/0045370 A1 | 2/2022 | Matsuzaki et al. | | |
| 2022/0045532 A1 | 2/2022 | Onuki et al. | | |
| 2022/0052387 A1 | 2/2022 | Takahashi et al. | | |
| 2022/0052535 A1 | 2/2022 | Yamazaki et al. | | |
| 2022/0052541 A1 | 2/2022 | Kozuma et al. | | |
| 2022/0077705 A1 | 3/2022 | Takahashi et al. | | |
| 2022/0085427 A1 | 3/2022 | Tajima et al. | | |
| 2022/0094177 A1 | 3/2022 | Okamoto et al. | | |

FOREIGN PATENT DOCUMENTS

| | | | | |
|---|---|---|---|---|
| CN | 108242832 B | * | 11/2021 | ....... G01R 19/16542 |
| JP | 3690992 B2 | * | 8/2005 | ............. Y02A 30/27 |
| JP | 3873623 B2 | * | 1/2007 | ............ G01R 31/389 |
| JP | 2007020336 A | * | 1/2007 | ................ H02J 7/00 |
| JP | 2007-240521 A | | 9/2007 | |
| JP | 2007-336698 A | | 12/2007 | |
| JP | 2009-133676 A | | 6/2009 | |
| JP | 2010-066161 A | | 3/2010 | |
| JP | 2012065392 A | * | 3/2012 | ............. Y02E 60/10 |
| JP | 2012-198977 A | | 10/2012 | |
| JP | 2013-096752 A | | 5/2013 | |
| JP | 2013-172532 A | | 9/2013 | |
| JP | 2013-233072 A | | 11/2013 | |
| JP | 2019023853 A | * | 2/2019 | ............... G06N 3/04 |
| KR | 2012-0102018 A | | 9/2012 | |

OTHER PUBLICATIONS

Machine Translation for JP2007020336 to "Uejima Takaki, Jan. 25, 2007, Failure Detection Device for Battery Malfunction Detection Circuit, para. [0010],[0015]-[0016],[0038]" (Year: 2007).*
JP-2007020336-A (Year: 2007).*
JP-2012065392A-Description (Year: 2012).*
International Search Report (Application No. PCT/IB2020/051042) Dated Apr. 21, 2020.
Written Opinion (Application No. PCT/IB2020/051042) Dated Apr. 21, 2020.

* cited by examiner

410

420

430

440

450

460

470

In charging

PROTECTION CIRCUIT FOR SECONDARY BATTERY AND ABNORMALITY DETECTION SYSTEM OF SECONDARY BATTERY

CROSS REFERENCE TO RELATED APPLICATIONS

This application is a U.S. National Phase Application under 35 U.S.C. § 371 of International Application PCT/IB2020/051042, filed on Feb. 11, 2020, which is incorporated by reference and claims the benefit of foreign priority applications filed in Japan on Feb. 25, 2019, as Application No. 2019-031868 and on Apr. 2, 2019, as Application No. 2019-070562.

TECHNICAL FIELD

One embodiment of the present invention relates to an object, a method, or a manufacturing method. Alternatively, the present invention relates to a process, a machine, manufacture, or a composition (composition of matter). One embodiment of the present invention relates to a semiconductor device, a display device, a light-emitting device, a power storage device, a lighting device, an electronic device, or a manufacturing method thereof. One embodiment of the present invention relates to a vehicle or an electronic device for vehicles provided in a vehicle. In particular, one embodiment of the present invention relates to a protection circuit of a secondary battery, a charge control method of a secondary battery, an abnormality detection system for a secondary battery, a management system for a secondary battery, and an electronic device including a secondary battery.

Note that in this specification, a power storage device refers to every element and device having a function of storing electric power. Examples of the power storage device include a secondary battery such as a lithium-ion secondary battery, a lithium-ion capacitor, an all-solid-state battery, and an electric double layer capacitor.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry, for portable information terminals such as mobile phones, smartphones, tablets, and notebook computers; portable music players; digital cameras; medical equipment; next-generation clean energy vehicles such as hybrid vehicles (HV), electric vehicles (EV), and plug-in hybrid electric vehicles (PHV or PHEV); and the like. The lithium-ion secondary batteries are essential as rechargeable energy supply sources for today's information society.

In a portable information terminal, an electric vehicle, or the like, a plurality of secondary batteries connected in series or in parallel and provided with a protection circuit is used as a battery pack (also referred to as an assembled battery). Note that a battery pack means a container (a metal can or a film exterior body) in which a plurality of secondary batteries and a predetermined circuit are stored together for easy handling of secondary batteries. The battery pack has an ECU (Electronic Control Unit) in order to manage the operation state.

The secondary battery used in an electric vehicle or a hybrid electric vehicle deteriorates due to the number of charging, depth of discharge, charging current, charging environment (temperature change), or the like. The deterioration also depends on the usage of the user; and charging temperatures, frequency of fast charging, charging amount from regenerative braking, charging timing with a regenerative brake, and the like might be related to the deterioration.

Patent Document 1 discloses a battery state detection device that detects a minute short circuit of a secondary battery and a battery pack that incorporates the battery state detection device.

REFERENCE

Patent Document

[Patent Document 1] Japanese Published Patent Application No. 2010-66161

SUMMARY OF THE INVENTION

Problems to be Solved by the Invention

An object is to ensure safety by detecting an abnormality of a secondary battery, for example, by detecting a phenomenon that lowers the safety of the secondary battery early and giving a warning to a user.

Another object is to provide a monitoring system for a highly safe secondary battery.

Means for Solving the Problems

Plural kinds of protection circuits are combined to obtain a monitoring system for a highly safe secondary battery.

The invention disclosed in this specification is an abnormality detection system for a secondary battery, including a first protection circuit that detects an abnormality in charging the secondary battery, and a second protection circuit that detects an abnormality in charging and discharging the secondary battery. The first protection circuit includes a comparison circuit including a transistor, and the second protection circuit includes an arithmetic circuit that calculates an output voltage of the secondary battery.

In the above configuration, the first protection circuit performs abnormality detection of voltage using the comparison circuit in every sampling cycle. For the comparison circuit, an N-channel MOSFET or a P-channel MOSFET can be used, and as a material of the transistor used in the comparison circuit, SiC or GaN can be used.

In the above configuration, the second protection circuit calculates a charging capacity in charging and discharging by a Coulomb counter to detect an abnormality. The Coulomb counter is a remaining battery power detector, in which current flowing through a detection resistor (sense resistor) in charging and discharging is converted into voltage and the remaining battery power of the secondary battery is obtained on the basis of the converted voltage value.

In the above configuration, one of abnormalities in charging the secondary battery is a micro-short circuit, which can be detected by the first and the second protection circuits. Because a voltage value is used for abnormality detection in charging the secondary battery, overcharge and overdischarge can also be detected by the first and the second protection circuits. Overcharge is also one of the abnormalities in charging the secondary battery. Overdischarge is also one of the abnormalities in discharging the secondary battery. Early detection of these abnormalities by the first and the second protection circuits and giving a warning to a user enable the safety to be ensured.

The transistor in the first protection circuit may include an oxide semiconductor, and the oxide semiconductor include indium, gallium, or zinc. An OS transistor including an oxide semiconductor (also referred to as an OS FET) has a characteristic of significantly low off-state current. In the case of using the OS transistor as a transistor M1, the leakage current of the transistor M1 can be extremely low. That is, with the use of the transistor M1, written data can be retained for a long time and thus the frequency of refresh of a memory cell in which data is retained can be decreased. In addition, refresh operation of the memory cell can be omitted. Owing to extremely low leakage current, the memory cell can retain analog data.

A charge control circuit including a memory circuit including a transistor using an oxide semiconductor or a battery control system is referred to as BTOS (Battery operating system or Battery oxide semiconductor) in some cases.

In the charge control circuit, predetermined threshold current is set, whereby a sudden abnormality, specifically a micro-short circuit, or the like can be detected by a detected current value. The internal resistance decreases when a micro-short circuit occurs; hence, the amount of current that flows to a normal secondary battery becomes relatively small and a large amount of current flows to a secondary battery in which the abnormality has occurred, which is dangerous. In the charge control circuit, a controlled current value is kept and the current value can be monitored. An abnormality in a secondary battery can be detected early by detecting a micro-short circuit or the like.

A micro-short circuit refers to a minute short circuit in a secondary battery, and is not a short circuit of a positive electrode and a negative electrode of a secondary battery which makes charging and discharging impossible but a phenomenon in which a small amount of short circuit current flows through a minute short circuit portion for a short period. A micro-short circuit is presumably caused in the following manner: a plurality of charging and discharging operations generate deterioration, a metal element such as lithium or cobalt is precipitated in the battery, the growth of the precipitate generates a local current concentration in part of a positive electrode and part of a negative electrode, and the function of a separator partially stops or a by-product is generated.

Furthermore, a lithium-ion secondary battery is not limited to a secondary battery using an electrolytic solution and the present invention can also be applied to an all-solid-state secondary battery using a solid electrolyte. As examples of the solid electrolyte, high-molecular electrolytes and a variety of ceramics (for example, LAGP ($Li_{1.5}Al_{0.5}Ge_{1.5}(PO_4)_3$), $Li_{10}GeP_2S_{12}$, and the like) can be given. Examples of the high-molecular electrolyte include a high-molecular gel electrolyte containing an electrolyte solution and a high-molecular solid electrolyte not containing an electrolyte solution. In a high-molecular gel electrolyte, an electrolytic solution is injected into a polymer having a lithium-ion conductivity. Examples of the polymer having a lithium-ion conductivity include a polyethylene oxide (PEO) and a polypropylene oxide (PPO).

Effect of the Invention

The micro-short circuit is considered to be generated by deposition of lithium ions on carbon of a negative electrode in charging; thus, abnormality detection in charging is important. Accordingly, combination of a plurality of protection circuits enables a complementary double protection system in charging, and safety can be further enhanced.

MODE FOR CARRYING OUT THE INVENTION

Embodiments of the present invention are described in detail with reference to the drawings. Note that the present invention is not limited to the following description, and it is readily understood by those skilled in the art that modes and details of the present invention can be modified in various ways. In addition, the present invention should not be construed as being limited to the description of embodiments below.

Embodiment 1

Figure 1:
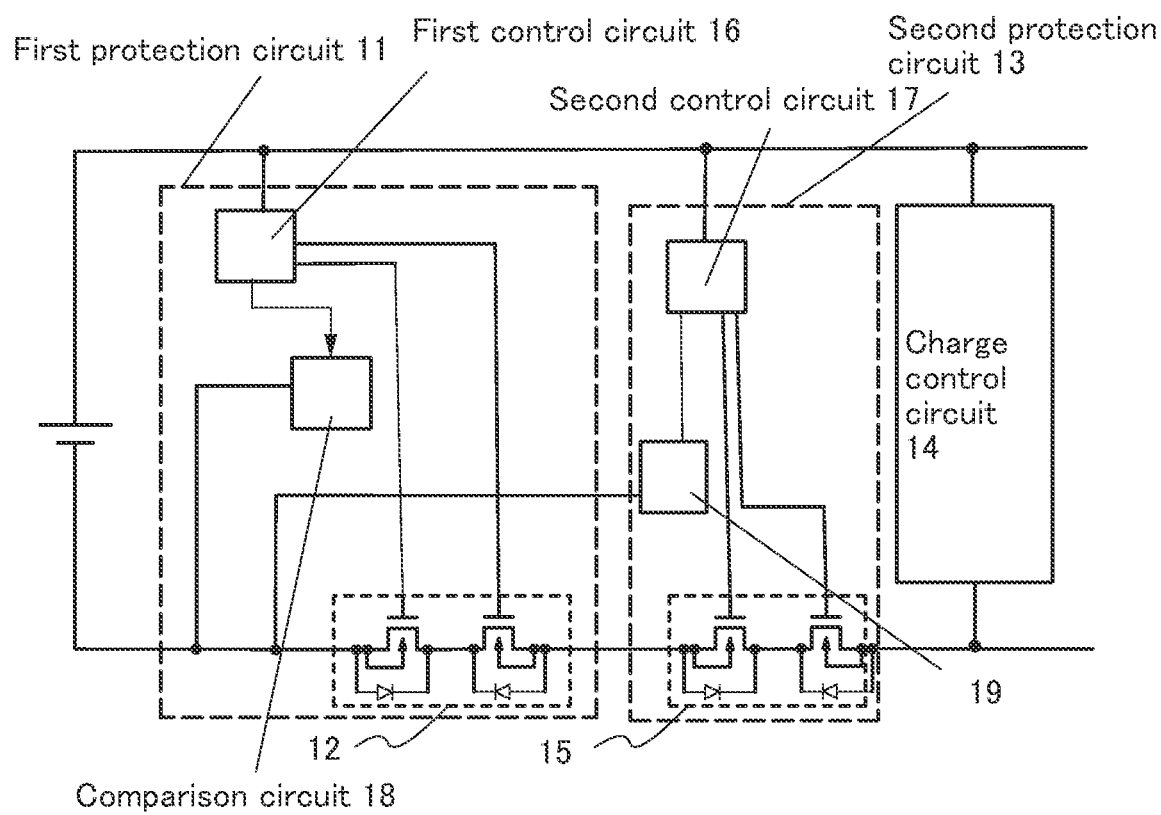
FIG. 1 is a block diagram illustrating one embodiment of the present invention.

In this embodiment, FIG. 1 illustrates an example in which a first protection circuit 11 and a second protection circuit 13 are provided for one secondary battery.

FIG. 1 is an example of a block diagram illustrating an example of a management system for a secondary battery.

As illustrated in FIG. 1, a charge control circuit 14 electrically connected to the secondary battery has two disconnecting transistors between the secondary battery and the charge control circuit 14. Disconnection of power supply by a disconnecting switch 12 leads to a charge stop state. Disconnection of power supply by a disconnecting switch 15 also leads to a charge stop state. As each of the disconnecting switches 12 and 15, a power transistor (also referred to as a power MOS) may be used; alternatively, an N-channel MOSFET or a P-channel MOSFET may be used; further alternatively, SiC or GaN can be used as another material. Further alternatively, an oxide semiconductor material containing In, Ga, or Zn can be used.

The first protection circuit 11 includes at least a first control circuit 16, a comparison circuit 18, and the disconnecting switch 12. A configuration may be such that the comparison circuit 18 is formed over a chip of the first control circuit 16. Alternatively, a configuration may be such that the comparison circuit 18 is formed over a chip of the disconnecting switch 12. Alternatively, a configuration may be such that the chip of the disconnecting switch 12 is attached over the chip of the first control circuit 16, and the comparison circuit 18 is formed over the disconnecting switch 12. For the attachment of the chips, known attachment techniques are used. In the first protection circuit 11, a micro-short circuit is detected by comparison with a preceding voltage that is fed back by using the comparison circuit 18, and the disconnecting switch 12 is turned off by the first control circuit 16, whereby charging is stopped.

The second protection circuit 13 includes at least a second control circuit 17, an AD converter 19, and the disconnecting switch 15. A configuration may be such that the AD converter 19 is formed over a chip of the second control circuit 17. Alternatively, a configuration may be such that the AD converter 19 is formed over a chip of the disconnecting switch 15. Alternatively, a configuration may be such that the chip of the disconnecting switch 15 is attached over the chip of the second control circuit 17, and the AD converter 19 is formed over the disconnecting switch 15. For the attachment of the chips, known attachment techniques are used. In the second protection circuit 13, numerical values such as a voltage of the secondary battery is digitized by the AD converter 19, an arithmetic operation is performed on the basis of that numerical values by the second control circuit 17 so that a micro-short circuit is detected, and the disconnecting switch 15 is turned off by the second protection circuit 13, whereby charging is stopped. The second control circuit 17 includes an arithmetic circuit such as a CPU for performing the arithmetic operation.

Overcharge due to an internal short circuit with a slight voltage change is hardly detected by the first protection circuit 11, and is suitably detected by the second protection circuit 13. In the second protection circuit 13, a warning signal can be also output from the second control circuit 17; thus, when the internal short circuit with a slight voltage change is detected, instantly turning off the disconnecting switch 15 is suspended, and warning display is given to a user so that the user can make the final decision whether to stop charging. The internal short circuit with a slight voltage change is not so urgent as to stop the use suddenly, but can be regarded as a sign of an abnormality. The internal short circuit with a slight voltage change is often caused by time deterioration of the secondary battery; thus, secondary battery replacement can be recommended to a user.

Furthermore, an instant voltage change is detected by the first protection circuit 11. The first protection circuit 11 can also be referred to as a simple protection circuit that immediately stops charging when detecting an abnormality, even though the cause for a sudden charging voltage change is unknown.

Even when the operation of one of the circuits is stopped for some reasons, a dangerous short circuit and overcharge can be stopped if the other circuit is operable to perform detection. In addition, a third protection circuit and/or a fourth protection circuit may be used.

As described above, a management system for a highly safe secondary battery can be provided by separately controlling charging with two or more circuits.

Figure 2:
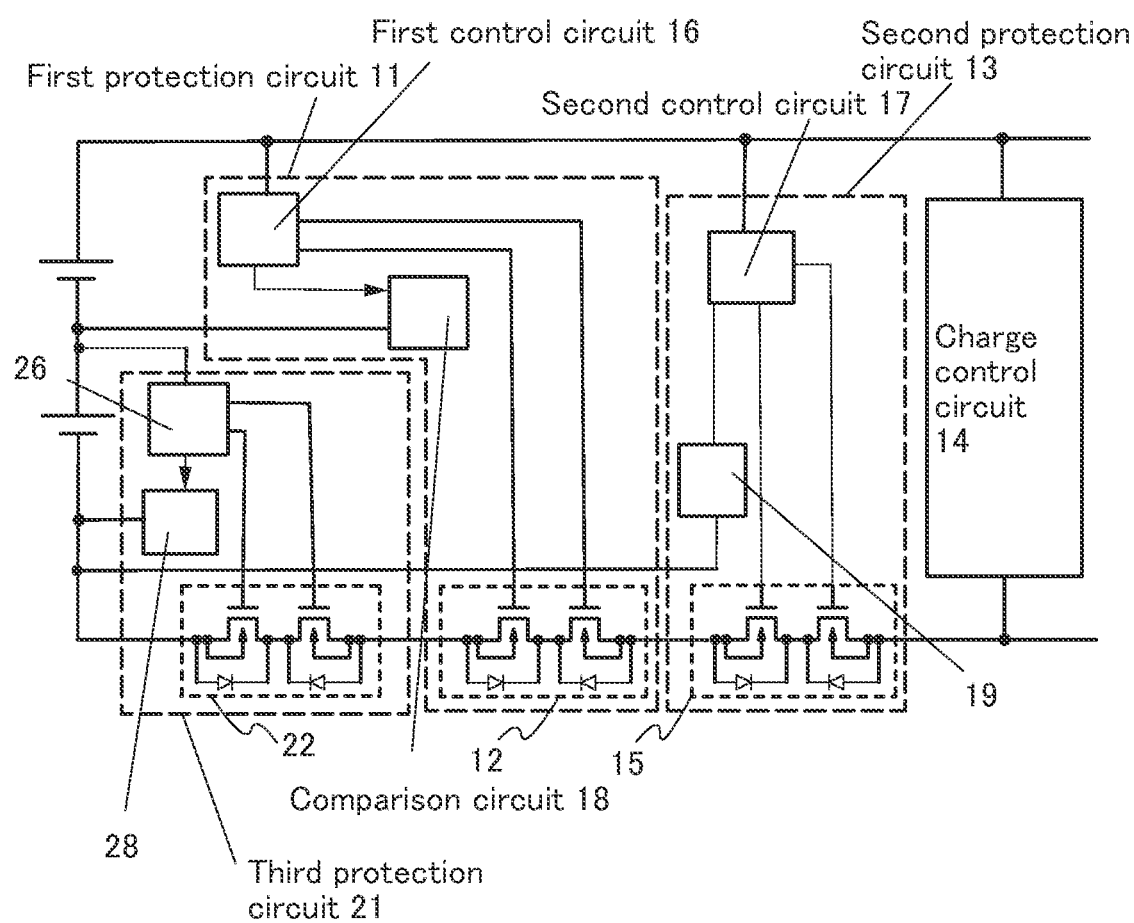
FIG. 2 is a block diagram illustrating one embodiment of the present invention.

FIG. 2 illustrates an example of using two secondary batteries. The first protection circuit 11 is provided for one secondary battery, and a third protection circuit 21 is provided for the other secondary battery.

The first protection circuit 11 can have the same configuration as the third protection circuit 21.

The third protection circuit 21 includes at least a third control circuit 26, a comparison circuit 28, and a disconnecting switch 22. In the third protection circuit 21, a micro-short circuit is detected by comparison with a preceding voltage that is fed back by using the comparison circuit 28, and the disconnecting switch 22 is turned off by the third control circuit 26, whereby charging is stopped.

Since the second control circuit includes a CPU and the like, the remaining battery power and the like of the plurality of secondary batteries can be obtained from an arithmetic operation. Accordingly, also in the case of including three or more secondary batteries, the number of second protection circuits 13 including the second control circuit 17 can be one. However, in the case of an electric vehicle or the like using a plurality of module packs each of which is assembly where a plurality of secondary batteries is connected in series or in parallel, the second protection circuit 13 is provided for each secondary battery module pack.

Also in the case of using a plurality of secondary batteries, charging is controlled by using a plurality of protection circuits, so that a management system for a highly safe secondary battery can be provided.

Embodiment 2

In this embodiment, an example of performing charge control of a secondary battery using two protection circuit modules is shown. Note that the protection circuit module refers to a module in which at least one or more kinds of an IC including a protection circuit including a transistor, a CPU, and another element (e.g., a capacitor or a resistor) is mounted over a circuit board including a connection terminal and the like.

Figure 3:
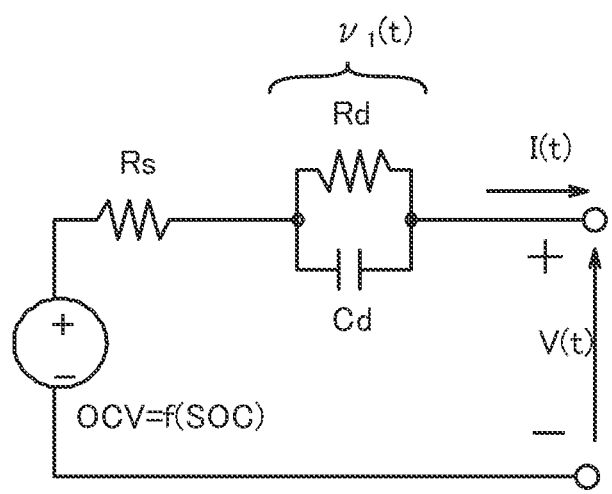
FIG. 3 is an example of a battery model used in one embodiment of the present invention.

FIG. 3 illustrates a battery model of a secondary battery to be used. A method for estimating a charge state of a secondary battery is obtained by calculation processing using an electric circuit model, in this embodiment, a foster-type electric circuit model. In this embodiment, calculation is performed using the electric circuit model, which can be realized with a low-cost microcomputer that has a relatively low-level arithmetic operation capacity.

Description is given below more specifically.

First, voltage values or current values of the secondary battery are measured by a detection unit (a voltage detection circuit or a current detection circuit). These data are obtained by a voltage measurement device or a current measurement device (also referred to as a current sensor), and stored in a memory device. Initial SOC(0) is calculated based on a voltage value obtained by a voltage measurement device, specifically, charge and discharge characteristic data. Initial SOC(0) is an initial value of SOC. Furthermore, initial Rs is an initial value of direct current resistance Rs (also referred to as $R_O$), which is a resistance due to a process of ion migration. Five initial parameters, specifically, initial SOC (0), FCC, $R_0$, $R_d$, and $C_d$ can be obtained by optimization algorithm obtained from the charge and discharge characteristics measured in advance, specifically, by a Nelder-Mead method. Note that the Nelder-Mead method is algorithm that does not need a derivative.

Alternatively, as another calculation method of initial SOC(0), an open circuit voltage of the battery before beginning of the use is measured by the voltage detection circuit and initial SOC(0) can be determined from a map or a corresponding table of the relation between the open circuit voltage OCV obtained in advance and SOC. In this embodiment, f(SOC) is obtained from a look-up table of a SOC-OCV curve. Note that OCV is a voltage at which a battery is in electrochemical equilibrium, and has a corresponding relation with SOC (State Of Charge).

An estimated output voltage of the battery model illustrated in FIG. 3 can be represented by the following formula.

$$V = f(soc) + 1 \cdot Rs + v_1 \quad \text{[Formula 1]}$$

The update formula of SOC can be represented by the following formula.

$$SOC_k = SOC_{k-1} + \frac{I}{FCC} \times 100 \quad \text{[Formula 2]}$$

An overvoltage of a CR unit can be represented by the following formula.

$$V1_k = V1_{k-1}\left(1 - \frac{\pi^2}{4C_d R_d}\right) \times \frac{2}{C_d} I \quad \text{[Formula 3]}$$

According to these formulae, an abnormality detection program of a secondary battery can be formed.

In addition, displacement of a voltage error is used to detect a micro-short circuit. Displacement of a voltage error refers to a value obtained by calculating a voltage error in each time step and then taking a voltage difference between sequence steps (that is a difference between the present step and the step before the present step). The formula of a correction method of series resistance Rs described below enables noise to be reduced.

$$Rs = \frac{V_{ave} - V[3]}{I_{ave}} \quad \text{[Formula 4]}$$

The measurement value cannot be followed when sampling time is short; thus, the series resistance Rs is obtained from the average value in three steps.

A differential of the voltage error was calculated using the above formula to which data when a pseudo micro-short circuit has been generated was input, so that a voltage drop due to the pseudo micro-short circuit was able to be detected. When calculation was performed using charge and discharge data of the secondary battery, the threshold value for detecting the micro-short circuit was approximately greater than or equal to 15 mV and less than or equal to 20 mV. Thus, charge control of the secondary battery is performed such that the case where the threshold value exceeds 20 mV is detected as an abnormality. Note that the threshold value sometimes depends on the kind of secondary battery to be used; thus, the threshold value of a secondary battery to be used is preferably calculated in advance using the above formula and the like.

Furthermore, overcharge due to a slowly-generated internal short circuit can be detected. By conversion of the voltage just before charging, as OCV, into SOC, the amount of remaining battery power is accurately obtained and the overcharge is detected.

As a first detecting condition, charging is stopped when SOC exceeds 100%.

As a second detecting condition, charging is stopped when the value obtained by addition of the amount of charged current to the remaining battery power just before charging exceeds FCC.

When the amount of initial charge is calculated from OCV before charging, the following formulae are used.

$$Q_{charge} = \sum \text{Current} \times \Delta \text{Time} \quad \text{[Formula 5]}$$

$$Q_{charge\_begin} = \frac{SOC1}{100} \times FCC \quad \text{[Formula 6]}$$

$$Q_{charge\_begin} + \sum \text{Current} \times \Delta \text{Time} \approx FCC \quad \text{[Formula 7]}$$

In the above formula, the case where the left-hand side is greater than the right-hand side is regarded as overcharge.

As a third detecting condition, a full-charge capacity is calculated with a voltage just before charging and a voltage that has been sufficiently alleviated after the charging as OCV, and it is determined that overcharge occurs when the full-charge capacity is greater than the full-charge capacity in the past.

In that case, the following formula is used. Note that the voltage just before charging is set to SOC1, and the voltage that has been sufficiently alleviated after the charging is set to SOC2.

$$SOC2 = SOC1 + \frac{Q_{charge}}{FCC_{update}} \quad \text{[Formula 8]}$$

$$FCC_{update} = \frac{Q_{charge}}{SOC2 - SOC1} \times 100 \quad \text{[Formula 9]}$$

In a normal state, initial FCC and FCCupdate have substantially the same values. The case where the value of the FCCupdate becomes high is considered as an internal short circuit.

In the case of satisfying any of the above three detecting conditions, an abnormality can be detected as overcharge due to an internal short circuit that is slowly generated. Note that calculation time per step is approximately 2 msec; accordingly, it is also possible to manage to 100 or more secondary batteries connected in series when the sampling cycle is one second.

Figure 4:
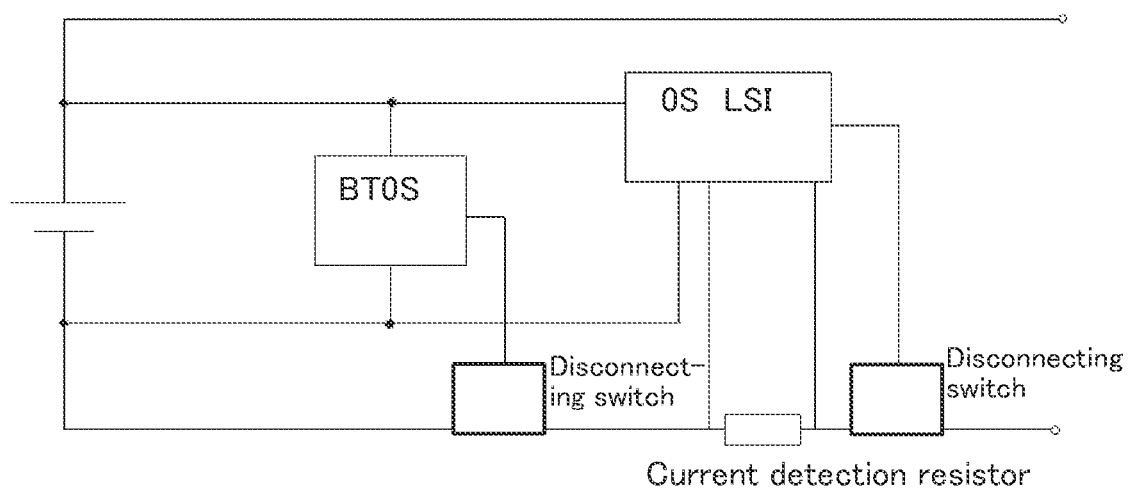
FIG. 4 is a block diagram illustrating one embodiment of the present invention.

A program in which the above-described detecting conditions are algorithm is created, and a circuit configuration illustrated in FIG. 4 is formed using an IC module including an OS transistor (OS LSI) capable of executing the program.

In the abnormality detection system for a secondary battery illustrated in FIG. 4, a disconnecting switch is turned off in the case where the IC module including an OS transistor (OS LSI) detects an abnormality. Also in the case where another IC module (BTOS) detects an abnormality, another disconnecting switch is turned off.

Note that the IC module including an OS transistor (OS LSI) is a component including a protection circuit module. The protection circuit module is a module which includes at least one kind of a circuit including an FET including an oxide semiconductor (OS FET), a CPU, and another element (e.g., a capacitor or a resistor), over a circuit board including a connection terminal and the like. The IC module including an OS transistor (OS LSI) is electrically connected to a current detection resistor. In this embodiment, a technique called normally-off computing in which power consumption of a CPU in an IC module including an OS transistor (OS LSI) is reduced is used. In the normally-off computing, power consumption of a CPU is reduced in such a manner that the supply of power to an integrated circuit such as a cache memory that is unused is stopped by power gating. In the normally-off computing, supply of power is stopped in a short period; thus, a memory element used as a buffer memory device (such as a cache memory) is required to not only be nonvolatile but also operate at a high speed. Furthermore, in the normally-off computing, if time (overhead time) required for data back up and data recovery due to the stop of supply of power in power gating is not short, it is difficult to stop the supply of power during a period when the CPU is not operated. As the overhead time is shorter and the break even time (BET) is shorter, the supply of power can be stopped even for a shorter time during which the CPU does not operate, so that power gating with fine time granularity can be performed.

Figure 18:
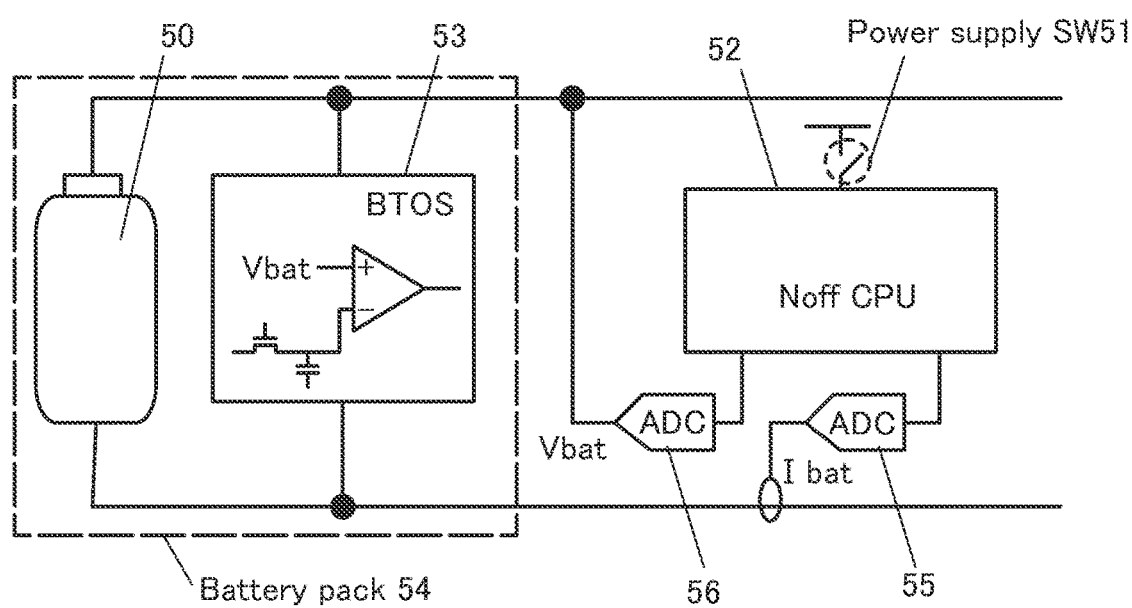
FIG. 18 is a diagram illustrating a double detection system illustrating one embodiment of the present invention.

An abnormality detection system for a secondary battery illustrated in FIG. 18 shows a double detection system that utilizes normally-off computing. In FIG. 18, a CPU used in the normally-off computing is expressed by Noff CPU. Power consumption can be reduced by tuning on/off a power supply SW51 of an Noff CPU 52. FIG. 18 illustrates a battery pack 54 including a secondary battery 50 and a BTOS 53, and an ADC 55 and an ADC 56 which are connected to the Noff CPU 52. Note that the ADC is an AD converter circuit. The ADC 55 is connected to a current Ibat of the secondary battery 50, and the ADC 56 is connected to a voltage Vbat of the secondary battery 50.

Figure 17:
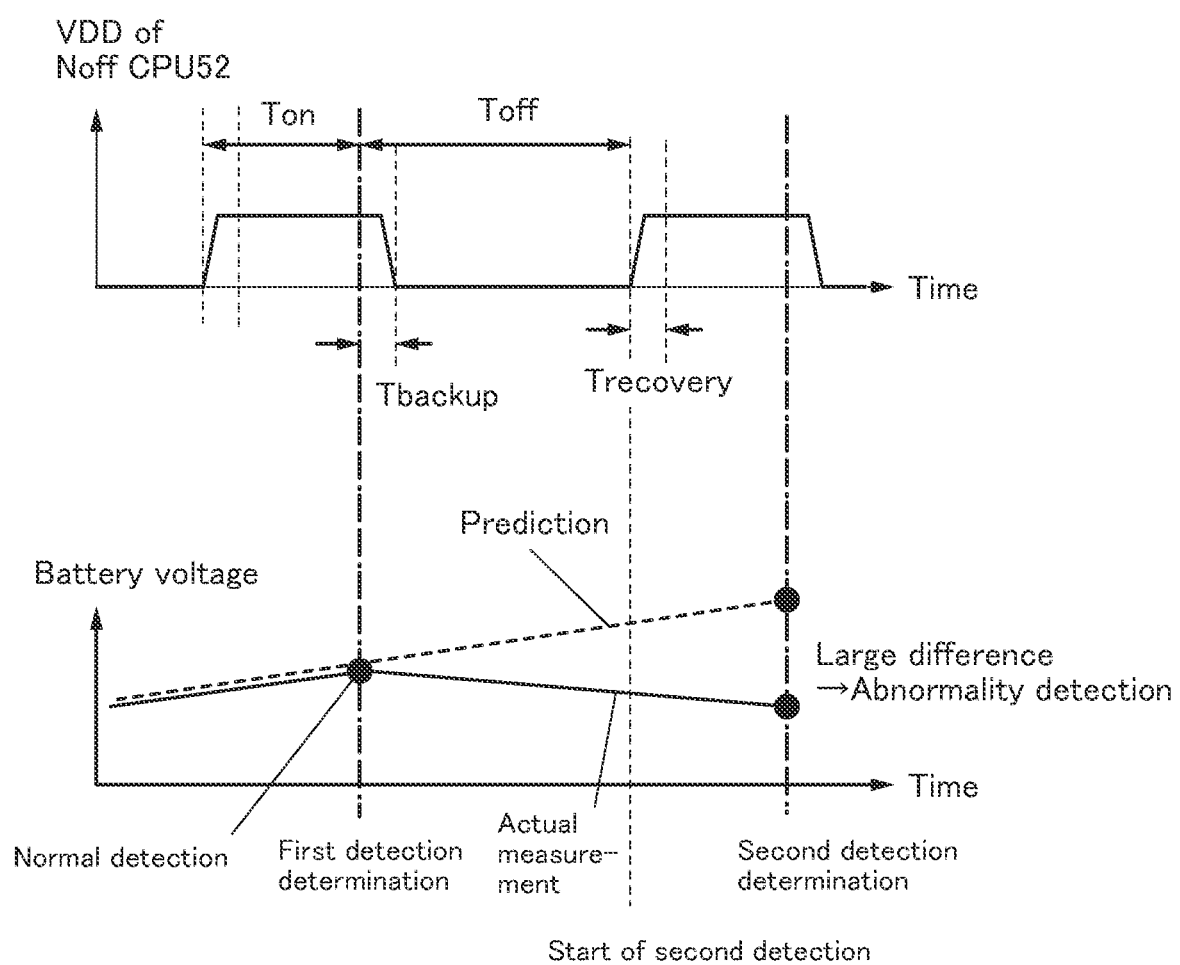
FIG. 17 is a diagram illustrating a part of a timing chart which illustrates one embodiment of the present invention.

Because a change in a battery state of the secondary battery is slow compared to the operation time of the CPU, a period for turning off the power supply SW51 is provided between a first detection period and a second detection period so that power consumption can be reduced. For example, when two detection periods are provided, a timing chart as illustrated in FIG. 17 is obtained. Note that the second detection period is an interval between a second detection start time and a second detection determination time in FIG. 17.

An on period ($T_{on}$) and an off period ($T_{off}$) of VDD of the Noff CPU 52 are switched by the power supply SW51, and data is backed up in a time required for bringing the Noff CPU into an off state ($T_{backup}$). Then, when the off state is switched to an on state again, time required for recovery of the backed-up data ($T_{recovery}$) is generated. Time required for data back up and data recovery (the total time of $T_{backup}$ and $T_{recovery}$) due to the stop of supply of power in this power gating is referred to as overhead time.

In FIG. 17, at the first detection determination time, the CPU determines that the measured value is normal because of a small difference between the estimated value and the measured value, and a battery state (voltage) at next detection determination time is estimated using the data on the normal battery state. Since the on period ($T_{on}$) can be terminated after calculation of the estimated value is completed, the data on the estimated value is backed up. Note that although the off period ($T_{off}$) is less than twice the on period ($T_{on}$) in FIG. 17, the off period is actually greater than or equal to five times the on period.

In the case where an abnormality of the secondary battery 50 has been generated by the second detection determination time, an arithmetic operation is performed in the CPU concurrently with or after the time required for recovery of the backed-up data on the estimated value ($T_{recovery}$), and the abnormality can be determined to occur when the difference between the estimated value and the measured value is large. The state of the secondary battery 50 can be checked by intermittently driving the Noff CPU 52 as described above. The off period ($T_{off}$), that is, the interval between the detection periods can be determined by a user or a designer. Note that FIG. 17 is an example in which abnormality detection is continuously performed even after an abnormality is detected; thus, a timing chart is obtained in which the data on the estimated value is backed up after abnormality detection; however, in the case where detection is stopped after the abnormality detection, the $T_{backup}$ period is not necessarily provided; that is, data is not necessarily backed up after the second detection determination.

Here, abnormality detection of another IC module (BTOS 53) is described below. The configuration of the IC module (BTOS 53) is described with reference to FIG. 5 that is a block diagram of a detection circuit for abnormal behavior such as a micro-short circuit. Note that a disconnecting switch including a gate electrically connected to the IC module (BTOS) in FIG. 4 corresponds to a power disconnecting switch 105 in FIG. 5.

In the IC module (BTOS), a circuit including an FET including an oxide semiconductor, a microcomputer, and another element (a capacitor, a resistor, and the like) are mounted over a circuit board (a rigid substrate (also referred to as a printed wiring board)). A circuit including an FET including an oxide semiconductor may be formed over an IC chip such as a microcomputer.

When retaining an offset charging voltage, a first memory 103 monitors the charging voltage. A second memory 104 retains output data. Note that the first memory 103 and the second memory 104 are each a memory circuit including an FET including an oxide semiconductor.

Specific operation of detecting abnormal behavior such as a micro-short circuit is described below.

When a memory writing signal becomes High at a detection timing, writing to the first memory 103 is performed. The first memory 103 stores the offset battery charging voltage. In the case of normal behavior, the result of comparison between the retained voltage and the charging voltage of the first memory 103 by a comparison circuit 102 is always High, so that a power disconnecting switch control signal also becomes High.

In the case where abnormal behavior such as a micro-short circuit is generated, a voltage drop of the charging voltage of the secondary battery is suddenly generated. At that time, an output signal of the comparison circuit 102 is inverted, so that abnormal behavior is detected. The power disconnecting switch 105 is kept in an off state by setting the power disconnecting switch control signal Low, and holding the Low potential in the second memory 104.

Figure 5:
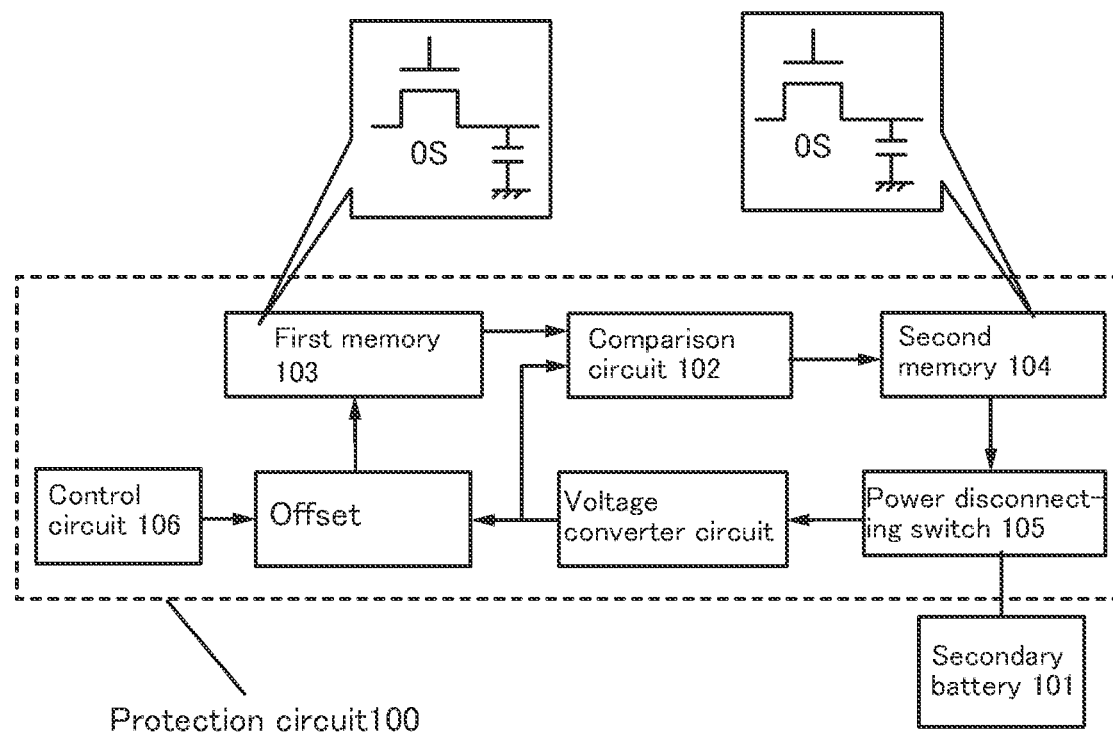
FIG. 5 is an example of a block diagram illustrating a first protection circuit which is one embodiment of the present invention.

A protection circuit 100 illustrated in FIG. 5 is included in the IC module (BTOS), and has a simple configuration. A control circuit 106 is configured to write the offset battery charging voltage to the first memory 103 every given sampling period. The protection circuit 100 illustrated in FIG. 5 is configured to perform detection all the time, which is different from the Noff CPU which performs detection intermittently.

By use of two IC modules with different detection timings as described above, a complementary protection system for the secondary battery can be realized, and a battery pack (also called an assembled battery) including these two IC modules and a device including the battery pack 54 can have enhanced safety. A battery pack refers to a container (a metal can or a film exterior body) in which a battery module composed of a plurality of secondary batteries and a predetermined circuit are stored for easy handling of secondary batteries.

Embodiment 3

Illustrated below is an example in which in order to increase the accuracy of abnormality detection, a neural network is used for an arithmetic operation such as estimation of the remaining capacity of a secondary battery.

A neural network is a method, which is neural network processing performed in a neural network portion (e.g., including a CPU (Central Processor Unit), a GPU (Graphics Processing Unit), an APU (Accelerated Processing Unit), a memory, and the like). Note that an APU refers to a chip integrating a CPU and a GPU into one.

Discharging of a secondary battery mounted on a device is random because it is likely to depend on the use of a user; however, charging is more likely to be estimated by the neural network as compared to discharging because the charging condition has been fixed. Comparatively many charging curves are used for learning data in advance, thereby estimating an accurate value by the use of the neural network. The secondary battery is actually measured to obtain charging curves, whereby initial SOC(0), FCC, $R_0$, $R_d$, and $C_d$ can be obtained by utilizing the neural network.

Specifically, various pieces of obtained data are evaluated and learned using machine learning or artificial intelligence, the estimated degree of deterioration of the secondary battery is analyzed, and then charging the secondary battery is stopped if there is any abnormality. It is preferable that learning be performed in advance to calculate a parameter used for estimating the deterioration degree.

Figure 6:
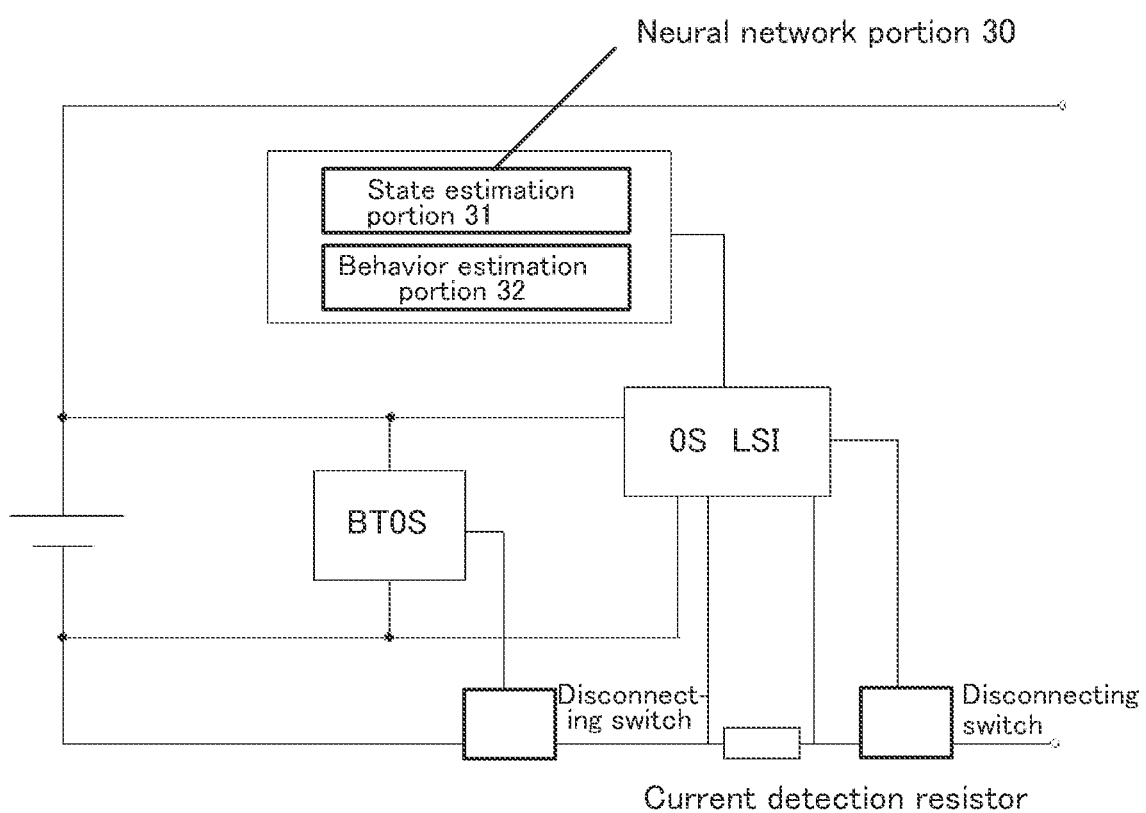
FIG. 6 is a block diagram illustrating one embodiment of the present invention.

FIG. 6 illustrates an example in which in addition to the configuration illustrated in FIG. 4, a neural network portion 30 is provided above the IC module including an OS transistor (OS LSI). The neural network portion 30 includes a state estimation portion 31 and a behavior estimation portion 32. A microprocessor capable of performing neural net arithmetic operation is used for the neural network portion 30.

In the case of performing learning while the secondary battery is used, for example, learning data can be obtained while an electric vehicle is running, so that the deterioration state of the secondary battery can be known. Note that the neural network portion 30 is used to estimate the deterioration state of the secondary battery. The neural network can be composed of a neural network including a plurality of hidden layers, that is, a deep neural network. Note that learning in a deep neural network is referred to as deep learning in some cases.

For the machine learning, first, a feature value is extracted from learning data. A relative change in amount that changes in accordance with time is extracted as a feature value (also referred to as a feature amount), and a neural network is made to learn on the basis of the extracted feature value. For a learning means, the neural network can be made to learn on the basis of learning patterns that are different between each time division. A coupling weight applied to the neural network can be updated according to a leaning result based on the leaning data. The coupling weight is also referred to as a feature amount.

Parameters of the battery model of an IC module including an OS transistor (OS LSI) may be reset on the basis of the estimation result of the deterioration state of the secondary battery using the neural network portion 30 so that abnormality detection can be performed with accuracy in a long term.

Furthermore, internal parameters of the battery model are calculated using the neural network portion 30, and the obtained values are input to the IC module including an OS transistor (OS LSI), whereby determination accuracy of the deterioration degree and accuracy of a battery gauge can be improved.

As a method for estimating the charge state of the secondary battery using the neural network portion 30, a regression model, for example, a Kalman filter or the like can be used for calculation processing.

A Kalman filter is a kind of infinite impulse response filter. In addition, multiple regression analysis is multivariate analysis and uses a plurality of independent variables in regression analysis. Examples of the multiple regression analysis include a least-squares method. The regression analysis requires a large number of observation values of time series, whereas the Kalman filter has an advantage of being able to obtain an optimal correction coefficient successively as long as there is accumulation of data to some extent. Moreover, the Kalman filter can also be applied to transient time series.

As a method for estimating the internal resistance and the charging rate (SOC) of the secondary battery, a non-linear Kalman filter (specifically an unscented Kalman filter (also referred to as UKF)) can be used. In addition, an extended Kalman filter (also referred to as EKF) can also be used. Moreover, SOC refers to a state of charge (also referred to as a charging rate), and is an index in which the fully charged state is 100% and the completely discharged state is 0%.

The initial parameters obtained by optimization algorithm are collected at every n cycles (n is an integer, e.g., 50), such data groups are used as teacher data to perform learning, and neural network processing is performed using the learning model, whereby SOC can be estimated with high accuracy. A program of software executing an inference program for performing the neural network processing can be written in a variety of programing languages such as Python (registered trademark), Go, Perl, Ruby, Prolog, Visual Basic, C, C++, Swift, and Java (registered trademark). The application may be designed using a framework such as Chainer (it can be used with Python), Caffe (it can be used with Python and C++), TensorFlow (it can be used with C, C++, and Python), and .NET. For example, the algorithm of LSTM is programmed with Python, and a CPU (Central Processing Unit) or a GPU (Graphics Processing Unit) is used. A chip in which a CPU and a GPU are integrated is sometimes called an APU (Accelerated Processing Unit), and this APU chip can also be used. AI (an IC incorporating a system (also referred to as an inference chip)) may be used. The IC incorporating an AI system is referred to as a circuit which performs neural network arithmetic operation (a microprocessor) in some cases.

The learning system includes a teacher creation device and a learning device. The teacher data creation device creates teacher data used when the learning device learns data (learning phase). The teacher data includes data whose recognition target is the same as that in processing target data and evaluation of a label corresponding to the data. The teacher data creation device includes an input data obtaining unit, an evaluation obtaining unit, and a teacher data creation unit. The input data obtaining unit may obtain data from data stored in the memory device; alternatively, the input data obtaining unit may obtain input data for learning via the Internet. The input data is data used for learning, which contains a current value and a voltage value of the secondary battery. The teacher data is not necessarily measured data, and initial parameters are varied to have variety so that data approximating to the measured data is formed. The charging rate (SOC) may be estimated by performing neural network processing using the predetermined characteristic database as teacher data. Data approximating to the measured data is formed on the basis of charge and discharge characteristics of one battery, and then neural network processing is performed using the predetermined characteristic database as teacher data, whereby it is possible to efficiently estimate SOC of the same kind of batteries.

In the case of using only optimization algorithm for the SOC estimation, the optimization algorithm has a large amount of calculation, leading to problems of convergence to a non-significant value, divergence where an optimum value has not been determined, and the like. The characteristics of the battery are non-linear; five initial parameters are obtained by a technique of numerical optimization of a non-linear function. The five initial parameters are as follows: full charge capacity FCC, direct current resistance $R_S$ ($R_0$), resistance $R_d$ in a diffusion process, diffusion capacity $C_d$, and initial SOC(0). Note that FCC (also referred to as full charge capacity or full capacity) is a rated capacity at a normal temperature of 25° C.

To execute the optimization processing to obtain the five initial parameters, a tool installed in Python (registered trademark) or Matlab (registered trademark) is used.

In the case where deterioration of the secondary battery proceeds, an SOC error may be generated when FCC of the initial parameters greatly changes; thus, the initial parameters used for the arithmetic operation for SOC estimation may be updated. The initial parameters to be updated are calculated with optimization algorithm using charge and discharge characteristic data that is actually measured in advance. By calculation processing with a regression model using the updated initial parameters, for example, a Kalman filter, SOC (determination phase) estimation can be performed with high accuracy even after deterioration. After that, the output SOC value is notified to a user. The determination phase refers to not only arithmetic operation performed on the basis of inference but also inference from obtained actual measurement data and processing up to the termination of the output of the estimated SOC value. In this specification, performing calculation processing using a Kalman filter is also referred to as performing Kalman filter processing.

Although the initial parameters are updated at given timings, it is preferable that the frequency of updating be high to estimate SOC with high accuracy and updating be performed periodically and successively.

Although illustrated in this embodiment is an example where the IC module including an OS transistor (OS LSI) is electrically connected to the neural network portion 30, wireless communication may be performed. If the five initial parameters can be determined using the neural network portion 30 on the basis of the parameters used for learning in advance, that is, the data of the secondary battery to be used, the configuration illustrated in FIG. 4 is employed, and the initial parameters may be used for data for the IC module including an OS transistor (OS LSI).

This embodiment can be freely combined with any of the other embodiments.

Embodiment 4

In this embodiment, circuit configuration examples of memory means are illustrated in FIG. 7A to FIG. 7G. FIG. 7A to FIG. 7G each function as a memory element. A memory element 410 illustrated in FIG. 7A includes the transistor M1 and a capacitor CA. The memory element 410 is a memory element including one transistor and one capacitor. For example, the first memory 103 and the second memory 104 described in Embodiment 2 are each a memory circuit including an FET including an oxide semiconductor, which can be formed using any one of the circuit configuration examples of memory means illustrated in FIG. 7.

A first terminal of the transistor M1 is connected to a first terminal of the capacitor CA. A second terminal of the transistor M1 is connected to a wiring BL. A gate of the transistor M1 is connected to a wiring WL. A back gate of the transistor M1 is connected to a wiring BGL. A second terminal of the capacitor CA is connected to a wiring CAL. A node to which the first terminal of the transistor M1 and the first terminal of the capacitor CA are electrically connected is referred to as a node ND.

In an actual transistor, a gate and a back gate are provided to overlap with each other with a channel formation region of a semiconductor layer therebetween. The gate and the back gate can each function as a gate. Thus, when one of them is referred to as a "back gate", the other is referred to as a "gate" or a "front gate" in some cases. In some other cases, one of them is referred to as a "first gate" and the other is referred to as a "second gate".

The potential of the back gate may be the same as the potential of the gate, or may be a ground potential or a given potential. By changing the potential of the back gate independently of that of the gate, the threshold voltage of the transistor can be changed.

Providing the back gate and setting the potentials of the gate and the back gate electrode to be the same, a region of the semiconductor layer through which carriers flow is enlarged in the film thickness direction; thus, the amount of carrier transfer is increased. As a result, the on-state current of the transistor is increased and the field-effect mobility is increased.

Thus, the transistor can be a transistor having high on-state current for its occupation area. That is, the occupation area of the transistor can be small for required on-state current. Accordingly, a semiconductor device having a high degree of integration can be provided.

The wiring BGL functions as a wiring for applying a potential to the back gate of the transistor M1. By applying a given potential to the wiring BGL, the threshold voltage of the transistor M1 can be increased or decreased.

Data write and read are performed in such a manner that a high-level potential is applied to the wiring WL to turn on the transistor M1 so that the wiring BL is electrically connected to the node ND.

The wiring CAL functions as a wiring for applying a predetermined potential to the second terminal of the capacitor CA. A fixed potential is preferably applied to the wiring CAL.

Figure 7A:
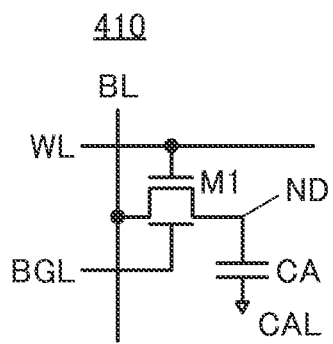
FIG. 7A, FIG. 7B, FIG. 7C, FIG. 7D, FIG. 7E, FIG. 7F, and FIG. 7G are diagrams illustrating examples of memory circuit configurations.
Figure 7B:
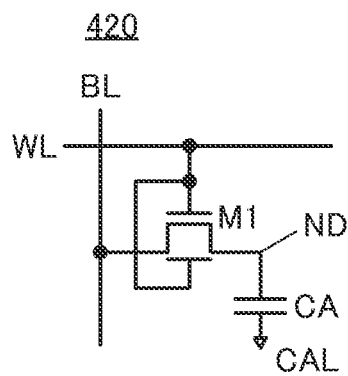

A memory element 420 shown in FIG. 7B is a modification example of the memory element 410. In the memory element 420, the back gate of the transistor M1 is electrically connected to the wiring WL. With such a configuration, a potential which is the same as that of the gate of the transistor M1 can be applied to the back gate of the transistor M1. Thus, the amount of current flowing through the transistor M1 can be increased when the transistor M1 is on.

Figure 7C:
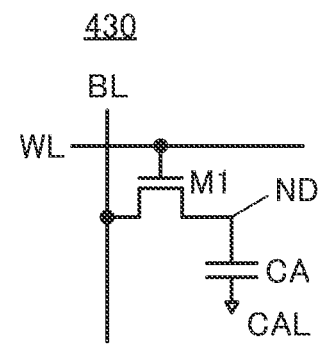

As in the memory element 430 shown in FIG. 7C, the transistor M1 may be a single-gate transistor (a transistor without a back gate). The memory element 430 has a configuration of the memory element 410 and the memory element 420 from which the back gate of the transistor M1 is eliminated. Thus, the number of fabrication steps of the memory element 430 can be smaller than those of the memory element 410 and the memory element 420.

The memory element 410, the memory element 420, and the memory element 430 are each a DRAM-type memory element.

An oxide semiconductor is preferably used for a semiconductor layer in which a channel of the transistor M1 is formed. In this specification and the like, a transistor including an oxide semiconductor in a semiconductor layer in which a channel is formed is also referred to as an "OS transistor" or "OS FET".

For example, as the oxide semiconductor, an oxide semiconductor containing any one of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, the oxide semiconductor is preferably an oxide semiconductor containing indium, gallium, and zinc.

An OS transistor has a characteristic of extremely low off-state current. When an OS transistor is used as the transistor M1, the leakage current of the transistor M1 can be extremely low. That is, written data can be retained for a long period of time with the transistor M1. Thus, the frequency of refresh of the memory element can be reduced. In addition, refresh operation of the memory element can be omitted. Furthermore, since the leakage current is extremely low, multilevel data or analog data can be retained in the memory element 410, the memory element 420, and the memory element 430.

In this specification and the like, a DRAM using an OS transistor is referred to as a DOSRAM (Dynamic Oxide Semiconductor Random Access Memory).

Figure 7D:
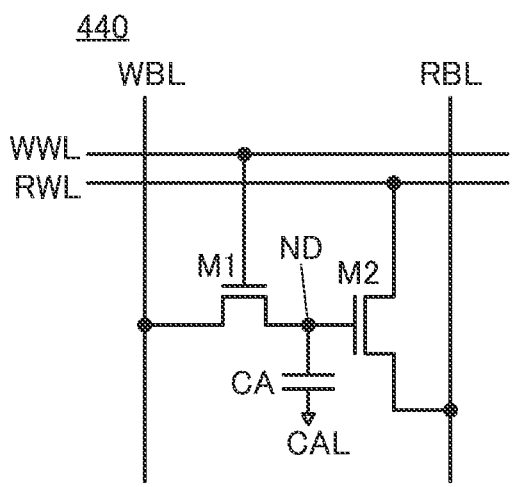

FIG. 7D illustrates a circuit configuration example of a gain-cell memory element including two transistors and one capacitor. A memory element 440 includes the transistor M1, a transistor M2, and the capacitor CA.

A first terminal of the transistor M1 is connected to a first terminal of the capacitor CA. A second terminal of the transistor M1 is connected to a wiring WBL. A gate of the transistor M1 is connected to a wiring WWL. A second terminal of the capacitor CA is connected to a wiring CAL. A first terminal of the transistor M2 is connected to a wiring RBL. A second terminal of the transistor M2 is connected to a wiring RWL. A gate of the transistor M2 is connected to the first terminal of the capacitor CA. A node to which the first terminal of the transistor M1, the first terminal of the capacitor CA, and the gate of the transistor M2 are electrically connected is referred to as a node ND.

The bit line WBL functions as a write bit line, the bit line RBL functions as a read bit line, the word line WWL functions as a write word line, and the word line RWL functions as a read word line. The transistor M1 has a function of a switch for controlling conduction or non-conduction between the node ND and the bit line WBL.

It is preferable to use an OS transistor as the transistor M1. As described above, since the OS transistor has extremely low off-state current, a potential written to the node ND can be retained for a long period of time when the OS transistor is used as the transistor M1. In other words, data written in the memory element can be retained for a long period of time.

A transistor to be used as the transistor M2 is not particularly limited. Any of an OS transistor, a Si transistor (a transistor in which silicon is used for a semiconductor layer), and other transistors may be used as the transistor M2.

Note that in the case where a Si transistor is used as the transistor M2, silicon used for the semiconductor layer may be amorphous silicon, polycrystalline silicon, low-temperature poly-silicon (LTPS), or single crystal silicon. Since a Si transistor has higher field-effect mobility than an OS transistor in some cases, the use of the Si transistor as a read transistor can improve the operation speed at the time of read.

In the case where an OS transistor is used as the transistor M1 and a Si transistor is used as the transistor M2, the two transistors may be provided in different layers to be stacked on one another. An OS transistor can be fabricated with the same manufacturing equipment by the same process as those of a Si transistor. Thus, hybridization of an OS transistor and a Si transistor is easy, and higher integration is also easy. The hybridization of an OS transistor and a Si transistor refers to one chip configuration in which a circuit including an OS transistor is provided over a circuit including Si FET formed over a silicon wafer.

Furthermore, when an OS transistor is used as the transistor M2, its leakage current when being non-selected can be extremely low; thus, reading accuracy can be improved. When an OS transistor is used for each of the transistor M1 and the transistor M2, the number of fabrication steps of the semiconductor device can be reduced and the productivity can be improved. It is possible to fabricate the semiconductor device at a process temperature of 400° C. or lower, for example.

Figure 7E:
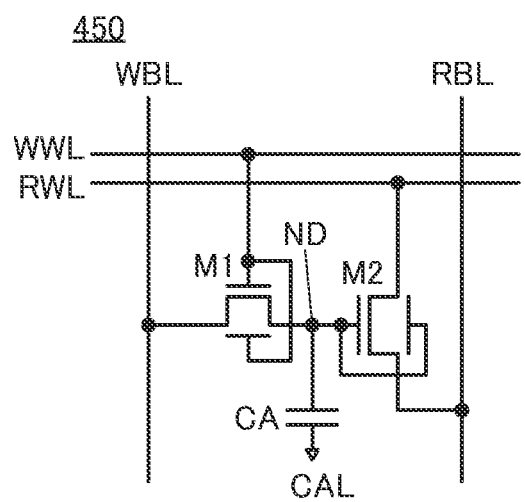
Figure 7F:
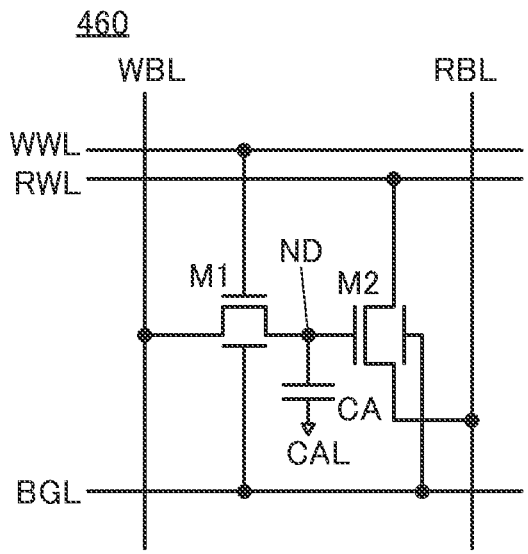
Figure 7G:
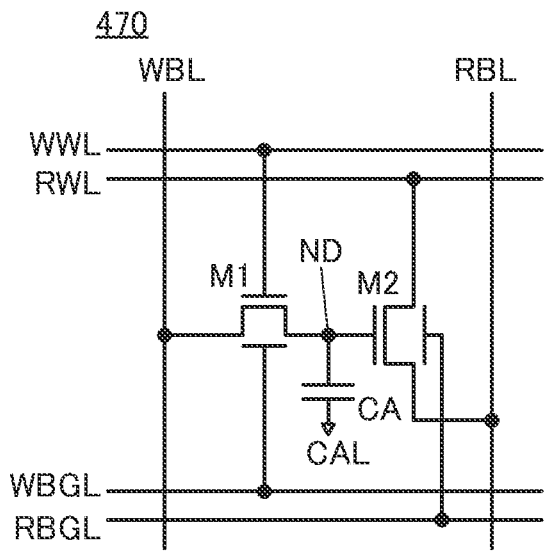

FIG. 7E to FIG. 7G each illustrate a circuit configuration example when a transistor including a back gate (a four-terminal transistor, also referred to as a "four-terminal element") is used for each of the transistor M1 and the transistor M2. A memory element 450 illustrated in FIG. 7E, a memory element 460 illustrated in FIG. 7F, and a memory element 470 illustrated in FIG. 7G are modification examples of the memory element 440.

In the memory element 450 illustrated in FIG. 7E, the gate and the back gate of the transistor M1 are electrically connected to each other. In addition, the gate and the back gate of the transistor M2 are electrically connected to each other.

In the memory element 460 shown in FIG. 7F, the back gate of the transistor M1 and the back gate of the transistor M2 are electrically connected to the wiring BGL. A predetermined potential can be applied to the back gates of the transistor M1 and the transistor M2 through the wiring BGL.

In the memory element 470 shown in FIG. 7G, the back gate of the transistor M1 is electrically connected to a wiring WBGL, and the back gate of the transistor M2 is electrically connected to a wiring RBGL. When the back gate of the transistor M1 and the back gate of the transistor M2 are connected to different wirings, the threshold voltages can be changed independently of each other.

The memory element 440 to the memory element 470 are each a 2Tr1C-type memory cell. In this specification and the like, a memory device constituting a 2Tr1 C-type memory cell using an OS transistor as the transistor M1 is referred to as a NOSRAM (Non-volatile Oxide Semiconductor Random Access Memory). The memory element 440 to the memory element 470 are capable of reading the potential of the node ND by amplifying the potential with the transistor M2. Since the off-state current of an OS transistor is extremely low, the potential of the node ND can be retained for a long time. In addition, non-destructive read is possible, with which the potential of the node ND remains retained even after the read operation.

Data retained in the memory element is data with less rewrite frequency. Thus, it is preferable to use, as the memory element, a NOSRAM, which is capable of non-destructive read and long-term retention of data.

The transistors shown in FIG. 7A, FIG. 7B, and FIG. 7E to FIG. 7G are each a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory.

Embodiment 5

In this embodiment is explained a transistor structure which can be used for the structure of the memory element in the above-described embodiment; specifically, a structure in which transistors with different electrical properties are stacked. In this embodiment, structures of transistors included in a memory circuit of a semiconductor device are particularly described. With such a structure, the degree of freedom in design of the semiconductor device can be increased. Stacking transistors with different electrical properties can increase the integration degree of the semiconductor device.

Figure 8:
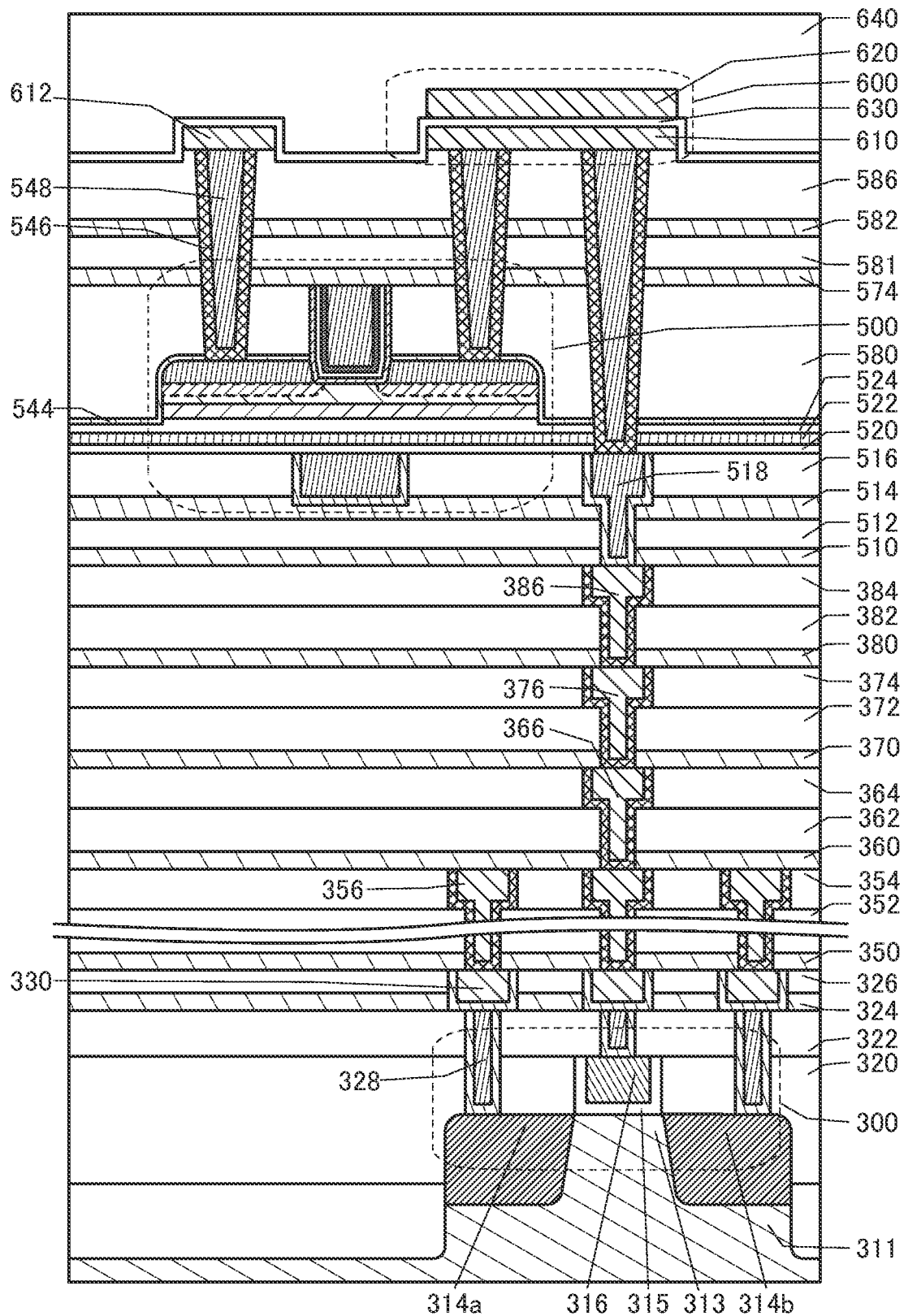
FIG. 8 is a schematic cross-sectional view illustrating a structure example of a semiconductor device.
Figure 10A:
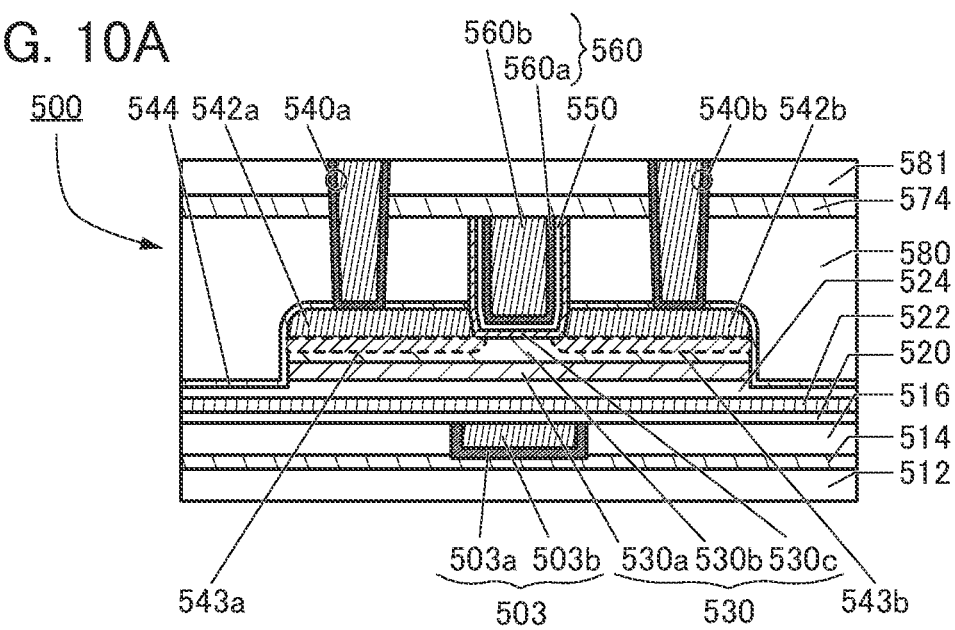
FIG. 10A, FIG. 10B, and FIG. 10C are schematic cross-sectional views illustrating structure examples of transistors.
Figure 10B:
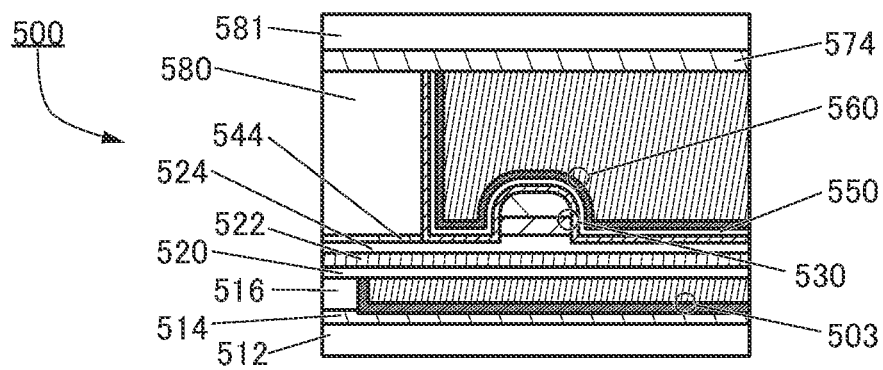

A semiconductor device illustrated in FIG. 8 includes a transistor 300, a transistor 500, and a capacitor 600. FIG. 10A is a cross-sectional view of the transistor 500 in the channel length direction, FIG. 10B is a cross-sectional view of the transistor 500 in the channel width direction, and FIG. 10C is a cross-sectional view of the transistor 300 in the channel width direction.

The transistor 500 is an OS transistor. The transistor 500 has low off-state current. Thus, a potential can be retained in the node NH for a long period of time. Thus, the frequency of writing of a potential to the node NH is reduced, whereby the power consumption of the semiconductor device can be reduced.

The semiconductor device described in this embodiment includes the transistor 300, the transistor 500, and the capacitor 600, as illustrated in FIG. 8. The transistor 500 is provided above the transistor 300, and the capacitor 600 is provided above the transistor 300 and the transistor 500.

Figure 10C:
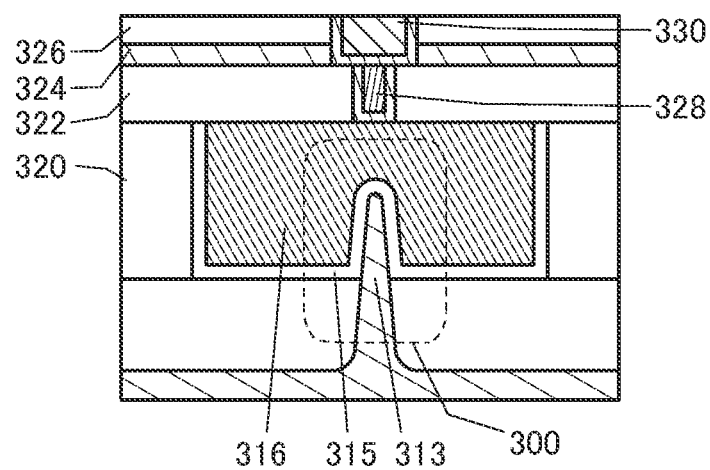

The transistor 300 is provided over a substrate 311 and includes a conductor 316, an insulator 315, a semiconductor region 313 that is part of the substrate 311, and a low-resistance region 314a and a low-resistance region 314b each functioning as a source region or a drain region In the transistor 300, the top surface and the side surface in the channel width direction of the semiconductor region 313 are covered with the conductor 316 with the insulator 315 therebetween, as illustrated in FIG. 10C. In this manner, the effective channel width is increased when the transistor 300 is a Fin type. Thus, the on-state characteristics of the transistor 300 can be improved. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of the conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 9:
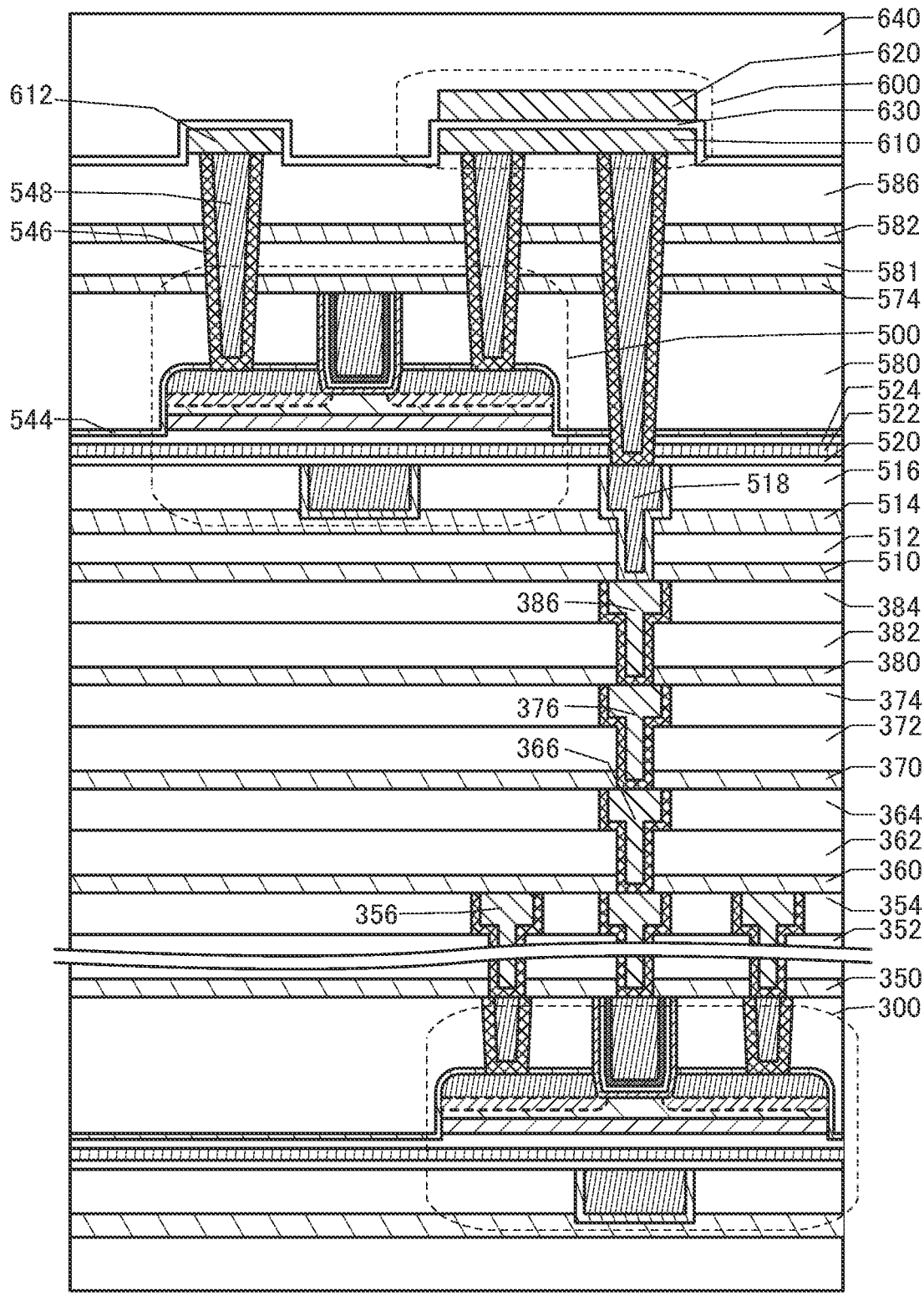
FIG. 9 is a schematic cross-sectional view illustrating a structure example of a semiconductor device.

Note that the transistor 300 illustrated in FIG. 8 is an example and the structure is not limited thereto; an appropriate transistor can be used in accordance with a circuit structure or a driving method. For example, when a semiconductor device is configured as a single-polarity circuit using only OS transistors, the transistor 300 employs a structure similar to that of the transistor 500 that is an OS transistor, as illustrated in FIG. 9. Note that the details of the transistor 500 are described later.

In this specification and the like, a single-polarity circuit refers to a circuit in which all of the transistors have the same polarity, for example. For example, a circuit in which all of the transistors are n-channel transistors can be referred to as a single-polarity circuit.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, deteriorates the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, the parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to be formed with a low-resistance conductive material such as aluminum or copper. The use of a low-resistance conductive material can reduce wiring resistance.

A wiring layer may be provided over the insulator 326 and the conductor 330. For example, in FIG. 8, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 or the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion provided in the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is retained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 8, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 or the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion provided in the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 8, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 or the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion provided in the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 8, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 or the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion provided in the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 is preferably used.

For the film having a barrier property against hydrogen, silicon nitride formed by a CVD method can be used, for example. Here, diffusion of hydrogen to a semiconductor element including an oxide semiconductor, such as the transistor 500, deteriorates the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent mixing of impurities such as hydrogen and moisture into the transistor 500 in the fabrication process and after the fabrication of the transistor. In addition, release of oxygen from the metal oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 or the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

As illustrated in FIG. 10A and FIG. 10B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 10A and FIG. 10B, an insulator 544 is preferably provided between the insulator 580 and the oxide 530a, the oxide 530b, the conductor 542a, and the conductor 542b. In addition, as illustrated in FIG. 10A and FIG. 10B, the conductor 560 preferably includes a conductor 560a provided inside the insulator 550 and a conductor 560b embedded inside the conductor 560a. As illustrated in FIG. 10A and FIG. 10B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 8, FIG. 9, FIG. 10A, and FIG. 10B is an example, and the structure is not limited thereto; an appropriate transistor can be used in accordance with a circuit configuration or a driving method.

Here, the conductor 560 functions as a gate electrode of the transistor 500, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, drain current at the time when a potential applied to the conductor 560 is 0 V can be lower in the case where a negative potential is applied to the conductor 503 than in the case where a negative potential is not applied to the conductor 503.

The conductor 503 is positioned to include a region overlapping with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (s-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Although the transistor 500 in which the conductor 503a and the conductor 503b are stacked is illustrated, the present invention is not limited thereto. For example, the conductor 503 may have a single-layer structure or a stacked-layer structure of three or more layers.

Here, for the conductor 503a, a conductive material which has a function of inhibiting diffusion of impurities such as a hydrogen atom, a hydrogen molecule, a water molecule, and a copper atom (through which the impurities are less likely to pass) is preferably used. Alternatively, it is preferable to use a conductive material which has a function of inhibiting diffusion of oxygen (e.g., at least one of an oxygen atom, an oxygen molecule, and the like) (through which the oxygen is less likely to pass). Note that in this specification and the like, a function of inhibiting diffusion of impurities or oxygen means a function of inhibiting diffusion of any one or all of the above impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 503a is not necessarily provided. Note that the conductor 503b is shown as a single layer in the diagram but may have a stacked-layer structure, for example, a stack of any of the above conductive materials and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed by occurrence of a reaction in which a bond of $V_OH$ is cut, i.e., occurrence of a reaction of "$V_OH \rightarrow V_O + H$". Part of hydrogen generated at this time is bonded to oxygen to be $H_2O$, and removed from the oxide 530 or an insulator in the vicinity of the oxide 530 in some cases. Part of hydrogen is diffused into or gettered (also referred to as gettering) by the conductor 542 in some cases.

For the microwave treatment, for example, an apparatus including a power supply that generates high-density plasma or an apparatus including a power supply that applies RF to the substrate side is suitably used. Oxygen radicals at a high density can be generated when gas containing oxygen and high-density plasma are used. By applying RF to the substrate side, the oxygen radicals generated by high-density plasma can be introduced into the oxide 530 or the insulator in the vicinity of the oxide 530 efficiently. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a fabrication process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow$null". Furthermore, hydrogen remaining in the oxide 530 reacts with oxygen supplied to the oxide 530, so that the hydrogen can be removed as $H_2O$ (dehydration). This can inhibit recombination of hydrogen remaining in the oxide 530 with oxygen vacancies and formation of $V_OH$.

When the insulator 524 includes an excess-oxygen region, it is preferable that the insulator 522 have a function of inhibiting diffusion of oxygen (e.g., an oxygen atom and an oxygen molecule, or the like) (or that the insulator 522 be less likely to transmit the oxygen).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba, Sr)$TiO_3$ (BST). As miniaturization and high integration of transistors progress, a problem such as generation of leakage current may arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that the transistor 500 in FIG. 10A and FIG. 10B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In—M—Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (C-Axls Aligned Crystal Oxide Semiconductor) or a CAC-OS (Cloud-Aligned Composite Oxide Semiconductor). Furthermore, as the oxide 530, an In—Ga oxide or an In—Zn oxide may be used. The CAAC-OS and the CAC-OS will be described later.

Furthermore, a metal oxide with a low carrier concentration is preferably used for the transistor 500. In the case where the carrier concentration of the metal oxide is reduced, the concentration of impurities in the metal oxide is reduced so that the density of defect states is reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide easily moves by stress such as heat and an electric field; thus, the reliability of a transistor may be reduced when the metal oxide contains plenty of hydrogen. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) to obtain a metal oxide whose $V_OH$ is reduced enough. When a metal oxide in which impurities such as $V_OH$ are sufficiently reduced is used for a channel formation region of a transistor, stable electrical characteristics can be given.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities such as hydrogen are sufficiently reduced is used for a channel formation region of a transistor, stable electrical characteristics can be given.

When a metal oxide is used as the oxide 530, the carrier density of the metal oxide in the channel formation region is preferably lower than or equal to $1\times10^{18}$ cm$^{-3}$, further preferably lower than $1\times10^{17}$ cm$^{-3}$, further preferably lower than $1\times10^{16}$ cm$^{-3}$, further preferably lower than $1\times10^{13}$ cm$^{-3}$, further preferably lower than $1\times10^{12}$ cm$^3$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

Note that the layer is not limited to be formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, when the oxide 530 includes the oxide 530c over the oxide 530b, it is possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic ratio of the element M in constituent elements in the metal oxide used for the oxide 530a is preferably greater than the atomic ratio of the element M in constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a. Moreover, a metal oxide that can be used for the oxide 530a or the oxide 530b can be used for the oxide 530c.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 1:1:1 [atomic ratio] is used. As the oxide 530c, a metal oxide having In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c are preferably made low.

Specifically, when the oxide 530a and the oxide 530b as well as the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have high on-state current.

Note that semiconductor materials that can be used for the oxide 530 are not limited to the above metal oxides. A semiconductor material having a band gap (a semiconductor material that is not a zero-gap semiconductor) may be used for the oxide 530. For example, a single element semiconductor such as silicon, a compound semiconductor such as gallium arsenide, or a layered material (also referred to as an atomic layered material or a two-dimensional material) functioning as a semiconductor is preferably used as the semiconductor material. In particular, a layered material functioning as a semiconductor is preferably used as the semiconductor material.

Here, in this specification and the like, a layered material generally refers to a group of materials having a layered crystal structure. The layered crystal structure is a structure in which layers formed by covalent bonding or ionic bonding are stacked with bonding such as the Van der Waals force, which is weaker than covalent bonding or ionic bonding. The layered material has high electrical conductivity in a monolayer, that is, the two-dimensional electrical conductivity is high. When a material that functions as a semiconductor and has high two-dimensional electrical conductivity is used for a channel formation region, a transistor with high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 10, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 10A, a region 543a and a region 543b are sometimes formed as low-resistance regions in the oxide 530 at and near the interface with the conductor 542a (the conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately determined in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the oxide 530c. Like the insulator 524, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride are preferable because they are thermally stable.

When an insulator that releases oxygen by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably has a function of inhibiting oxygen diffusion from the insulator 550 into the conductor 560. Providing the metal oxide having a function of inhibiting diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as generation of leakage current may arise because of a thinner gate insulating film. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high relative permittivity.

Although the conductor 560 functioning as the first gate electrode has a two-layer structure in FIG. 10A and FIG. 10B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, the conductor 560a is preferably formed using a conductive material having a function of inhibiting diffusion of oxygen (e.g., at least one of oxygen atoms and oxygen molecules). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used for the oxide 530 can be used. In that case, when the conductor 560b is deposited by a sputtering method, the conductor 560a can have a reduced electric resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used for the conductor 560b. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided to include a region in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water and hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A material having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent mixing of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to that for the conductor 328 or the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the fabrication steps of the transistor 500. The insulator having a high barrier property against hydrogen or water is formed using a material similar to that for the insulator 522, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added can be used.

The conductor 612 and the conductor 610 each have a single-layer structure in FIG. 8; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

Using this structure, a semiconductor device using a transistor including an oxide semiconductor can be miniaturized or highly integrated.

Figure 11A:
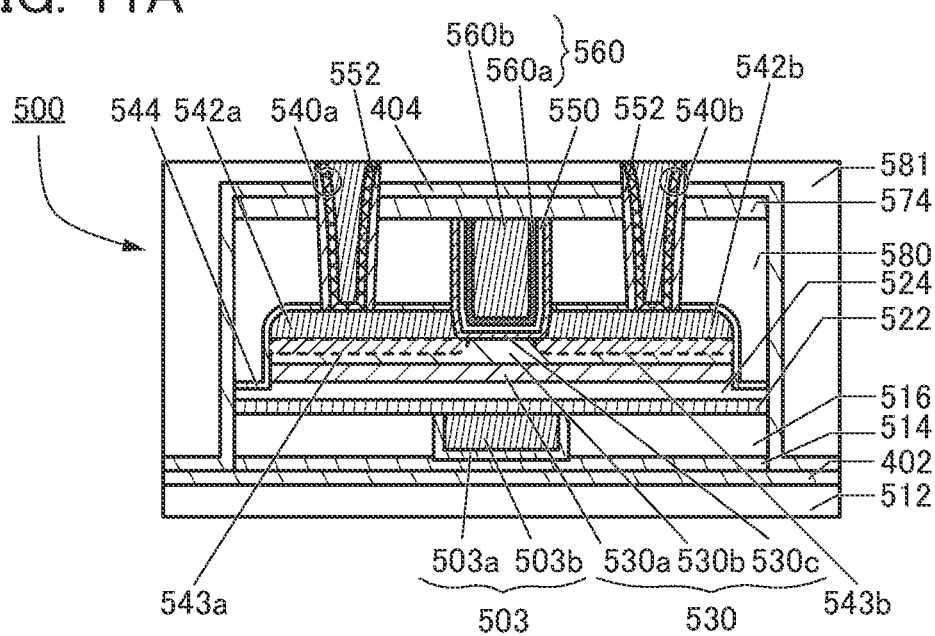
FIG. 11A and FIG. 11B are schematic cross-sectional views illustrating a structure example of a transistor.
Figure 11B:
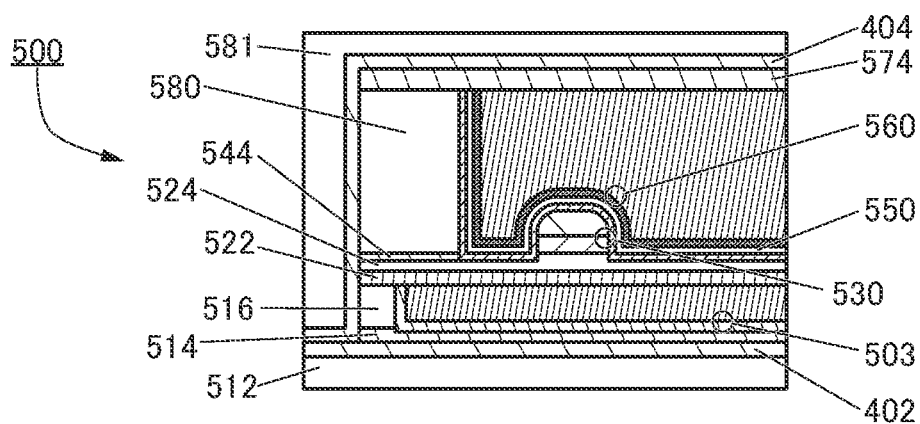

FIG. 11A and FIG. 11B illustrate a modification example of the transistor 500 illustrated in FIG. 10A and FIG. 10B. Note that the structures in FIGS. 11A and 11B can be applied to the transistor 300 and the like.

FIG. 11A is a cross-sectional view of the transistor 500 in the channel length direction and FIG. 11B is a cross-sectional view of the transistor 500 in the channel width direction. The transistor 500 illustrated in FIG. 11A and FIG. 11B is different from the transistor 500 illustrated in FIG. 10A and FIG. 10B in that an insulator 402 and an insulator 404 are included. In addition, the transistor 500 illustrated in FIG. 11A and FIG. 11B is different from the transistor 500 illustrated in FIG. 10A and FIG. 10B in that an insulator 552 is provided in contact with a side surface of the conductor 540a and the insulator 552 is provided in contact with a side surface of the conductor 540b. Moreover, the transistor 500 illustrated in FIG. 11A and FIG. 11B is different from the transistor 500 illustrated in FIG. 10A and FIG. 10B in that the insulator 520 is not included.

In the transistor 500 illustrated in FIG. 11A and FIG. 11B, the insulator 402 is provided over the insulator 512. The insulator 404 is provided over the insulator 574 and the insulator 402.

In the transistor 500 illustrated in FIG. 11A and FIG. 11B, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, for the insulator 402 and the insulator 404, silicon nitride or silicon nitride oxide that is a material having a high hydrogen barrier property is preferably used. This can inhibit the diffusion of hydrogen or the like into the oxide 530, whereby the deterioration of the characteristics of the transistor 500 can be inhibited.

The insulator 552 is provided in contact with the insulator 581, the insulator 404, the insulator 574, the insulator 580, and the insulator 544. The insulator 552 preferably has a function of inhibiting the diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. By using a material having a high hydrogen barrier property for the insulator 552, the diffusion of impurities such as water or hydrogen from the insulator 580 and the like into the oxide 530 through the conductor 540a and the conductor 540b can be inhibited. Furthermore, oxygen contained in the insulator 580 can be prevented from being absorbed by the conductor 540a and the conductor 540b.

Figure 12:
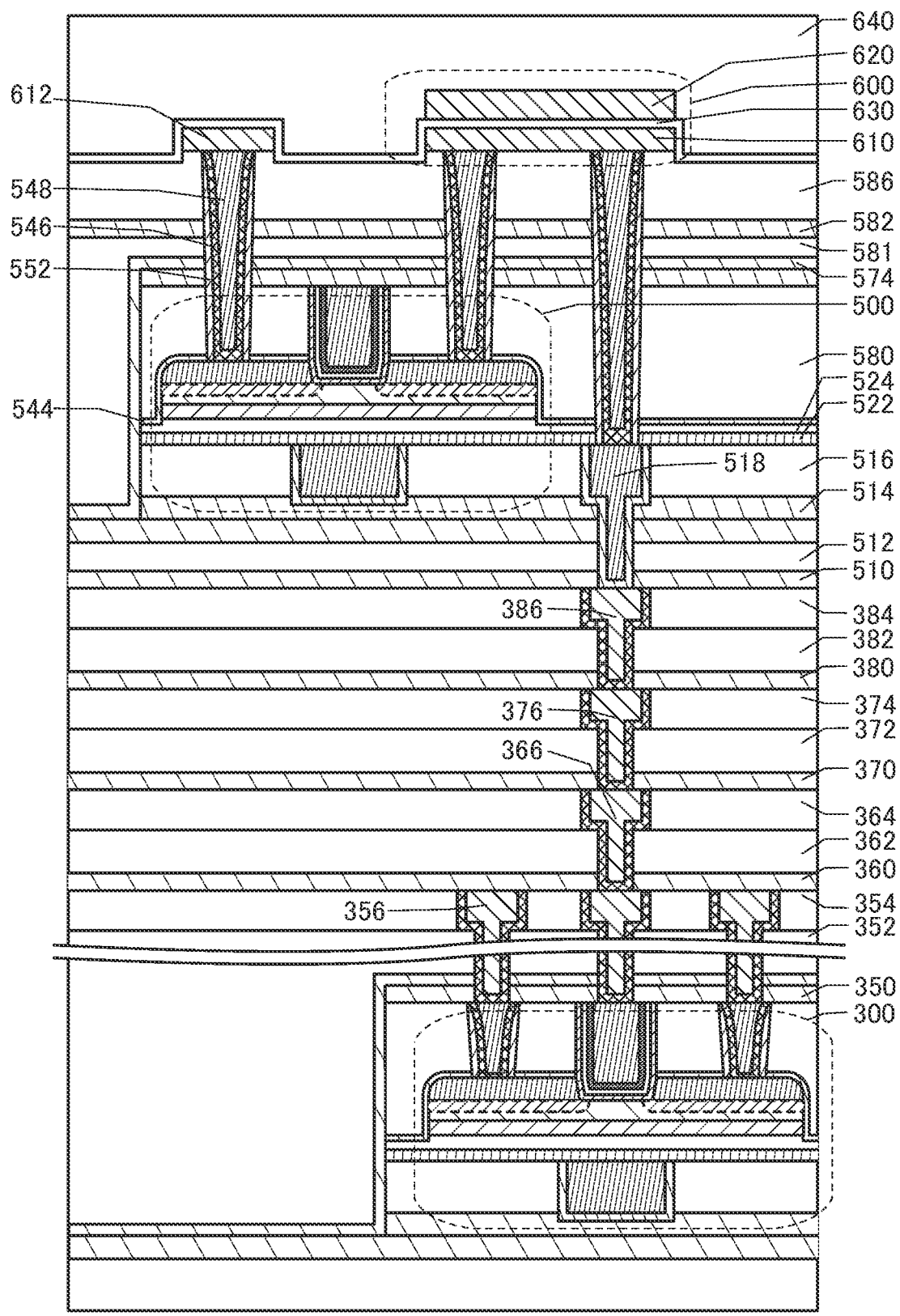
FIG. 12 is a schematic cross-sectional view illustrating a structure example of a semiconductor device.

FIG. 12 is a cross-sectional view illustrating a structure example of the semiconductor device in the case where the transistor 500 and the transistor 300 have the structure illustrated in FIG. 11A and FIG. 11B. The insulator 552 is provided on the side surface of the conductor 546.

Figure 13A:
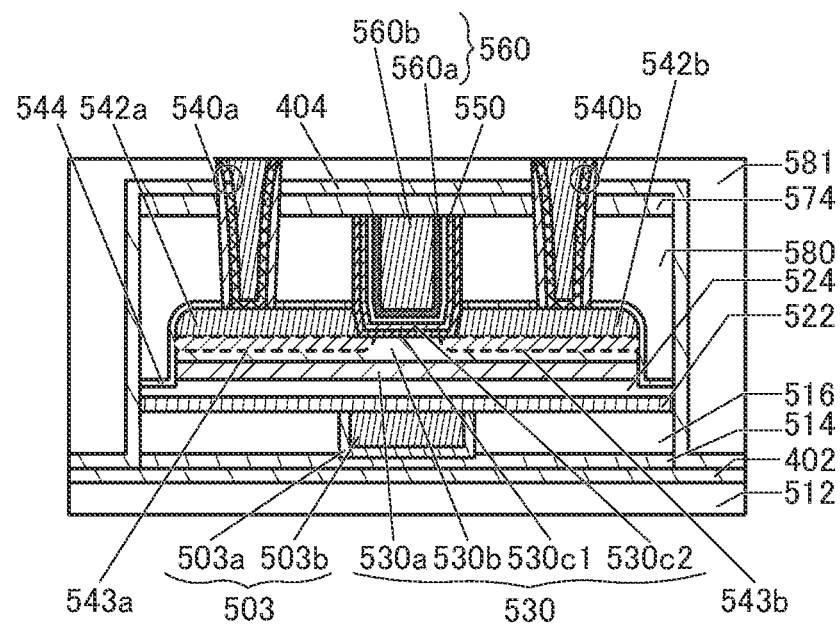
FIG. 13A and FIG. 13B are schematic cross-sectional views illustrating a structure example of a transistor.
Figure 13B:
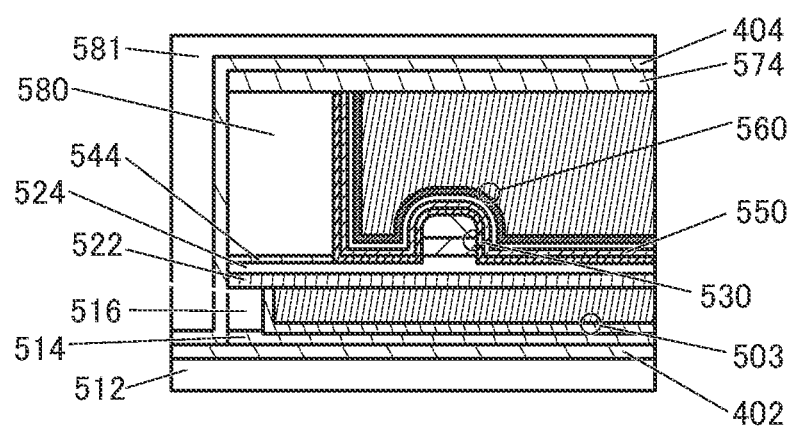

FIG. 13A and FIG. 13B illustrate a modification example of the transistor illustrated in FIG. 11A and FIG. 11B. FIG. 13A is a cross-sectional view of the transistor in the channel length direction and FIG. 13B is a cross-sectional view of the transistor in the channel width direction. The transistor illustrated in FIG. 13A and FIG. 13B is different from the transistor illustrated in FIG. 11A and FIG. 11B in that the oxide 530c has a two-layer structure of an oxide 530c1 and an oxide 530c2.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used as the oxide 530c1, for example. For the oxide 530c2, a material equivalent to a material that can be used for the oxide 530c when the oxide 530c has a single-layer structure can be used. For example, as the oxide 530c2, a metal oxide with n:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, the transistor can be a power MOS transistor, for example. Note that the oxide 530c included in the transistor illustrated in FIG. 10A and FIG. 10B can also have a two-layer structure of the oxide 530c1 and the oxide 530c2.

Note that the structure shown in FIG. 13A and FIG. 13B can also be employed for transistors other than the transistor 500 and the transistor 300.

Figure 14:
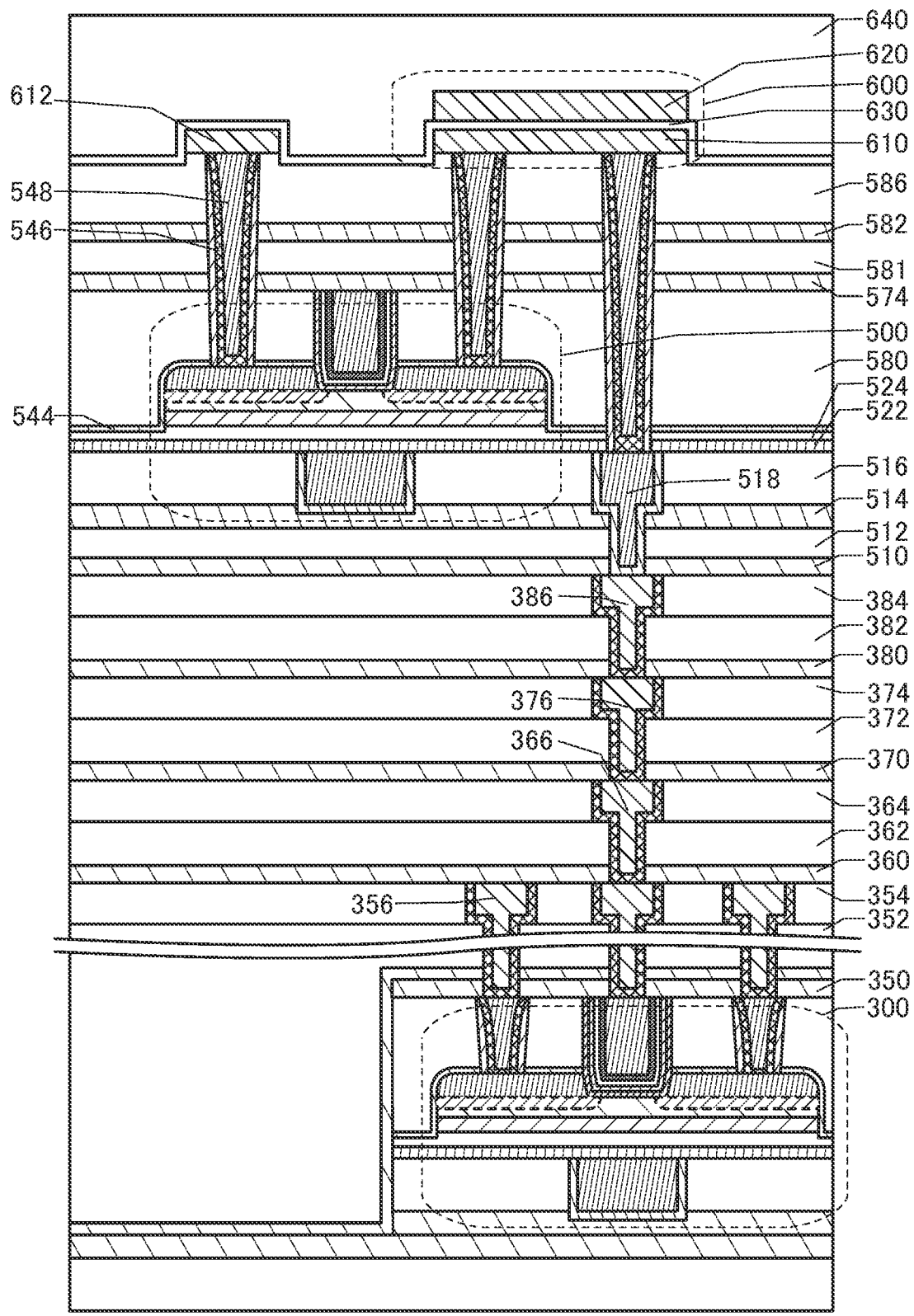
FIG. 14 is a schematic cross-sectional view illustrating a structure example of a semiconductor device.

FIG. 14 is a cross-sectional view illustrating a structure example of the semiconductor device when the transistor 500 has the structure illustrated in FIG. 10A and FIG. 10B and the transistor 300 has the structure illustrated in FIG. 13A and FIG. 13B. Note that a structure is employed where the insulator 552 is provided on the side surface of the conductor 546 as in FIG. 12. As illustrated in FIG. 14, both the transistor 300 and the transistor 500 can be OS transistors while having different structures from each other.

This embodiment can be implemented in an appropriate combination with the structures described in the other embodiments and the like.

Embodiment 6

Figure 16A:
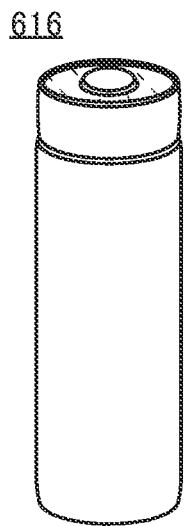
FIG. 16A is a perspective view illustrating an example of a secondary battery.
Figure 16B:
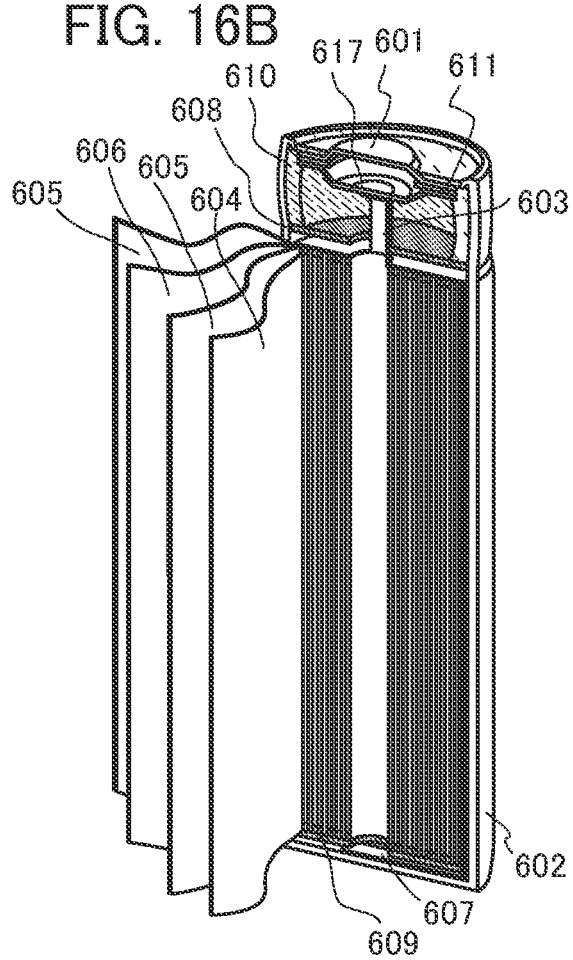
FIG. 16B is an exploded perspective view of the secondary battery.

An example of a cylindrical secondary battery is described with reference to FIG. 16A and FIG. 16B. A cylindrical secondary battery 616 includes, as illustrated in FIG. 16B, a positive electrode cap (battery lid) 601 on the top surface and a battery can (outer can) 602 on the side and bottom surfaces. The positive electrode cap and the battery can (outer can) 602 are insulated by a gasket (insulating packing) 610.

FIG. 16B illustrates a schematic cross-sectional view of the cylindrical secondary battery. Inside the battery can 602 having a hollow cylindrical shape, a battery element in which a belt-like positive electrode 604 and a belt-like negative electrode 606 are wound with a separator 605 therebetween is provided. Although not illustrated, the battery element is wound around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel or the like) can be used. The battery can 602 is preferably covered with nickel, aluminum, or the like to prevent corrosion due to an electrolyte solution. Inside the battery can 602, the battery element in which the positive electrode, the negative electrode, and the separator are wound is interposed between a pair of insulating plates 608 and 609 that face each other. Furthermore, a nonaqueous electrolyte solution (not illustrated) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolyte solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical storage battery are wound, active materials are preferably formed on both sides of current collectors. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 617 and the bottom of the battery can 602, respectively. The safety valve mechanism 617 is electrically connected to the positive electrode cap 601 through a PTC element (Positive Temperature Coefficient) 611. The safety valve mechanism 617 cuts off the electrical connection between the positive electrode cap 601 and the positive electrode 604 when the increased internal pressure of the battery exceeds a predetermined threshold value. In addition, the PTC element 611 is a thermally sensitive resistor whose resistance increases in the case where temperature rises, and limits the amount of current by increasing the resistance to prevent abnormal heat generation. Barium titanate ($BaTiO_3$)-based semiconductor ceramic or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode and the cathode are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification, the positive electrode is referred to as a "positive electrode" or a "+ electrode (plus electrode)" and the negative electrode is referred to as a "negative electrode" or a "− electrode (minus electrode)" in any of the case where charging is performed, the case where discharging is performed, the case where reverse pulse current is made to flow, and the case where charging current is made to flow. The use of terms such as anode (positive electrode) and cathode (negative electrode) related to oxidation reaction and reduction reaction might cause confusion because the anode and the cathode are reversed in charging and in discharging. Thus, the terms anode and cathode are not used in this specification. If the term the "anode" or the "cathode" is used, it should be clearly mentioned that the anode or the cathode is which of the one at the time of charging or the one at the time of discharging and corresponds to which of a positive electrode (plus electrode) or a negative electrode (minus electrode).

Figure 16C:
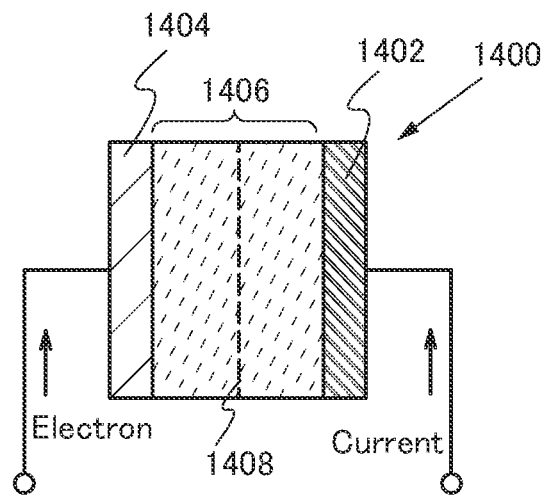
FIG. 16C is a model diagram of the secondary battery in charging.

A charger is connected to two terminals shown in FIG. 16C to charge a storage battery 1400. The storage battery 1400 includes a separator 1408 and an electrolyte solution 1406 between the positive electrode 1402 and the negative electrode 1404. As the charging of the storage battery 1400 proceeds, a potential difference between electrodes increases. The positive direction in FIG. 16C is the direction in which current flows from a terminal outside the storage battery 1400 to a positive electrode 1402; from the positive electrode 1402 to a negative electrode 1404 in the storage battery 1400; and from the negative electrode to a terminal outside the storage battery 1400. In other words, the direction in which charging current flows is regarded as the direction of current.

In this embodiment, an example of a lithium-ion secondary battery is shown; however, it is not limited to a lithium-ion secondary battery and a material including an element A, an element X, and oxygen can be used as a positive electrode material for the secondary battery. The element A is preferably one or more selected from the Group 1 elements and the Group 2 elements. As a Group 1 element, for example, an alkali metal such as lithium, sodium, or potassium can be used. As a Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. In addition, the negative electrode active material layer may contain a conductive additive and a binder.

For the negative electrode active material, an element that enables charge and discharge reactions by an alloying reaction and a dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon, and silicon in particular has a high theoretical capacity of 4200 mAh/g.

In addition, the secondary battery preferably includes a separator. As the separator, for example, a fiber containing cellulose such as paper; nonwoven fabric; a glass fiber; ceramics; a synthetic fiber using nylon (polyamide), vinylon (polyvinyl alcohol-based fiber), polyester, acrylic, polyolefin, or polyurethane; or the like can be used.

Figure 15A:
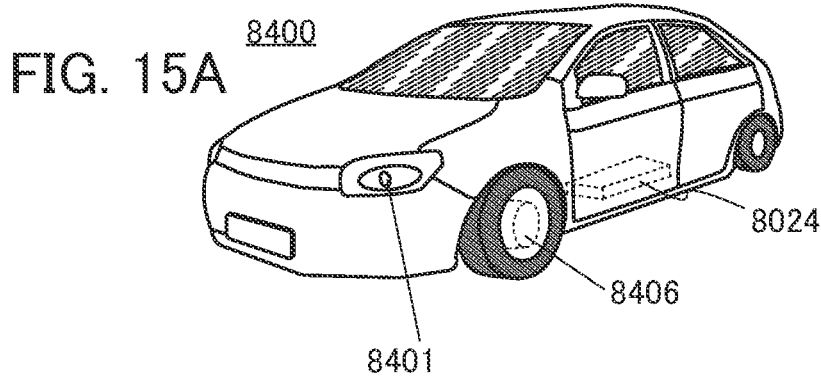
FIG. 15A, FIG. 15B, and FIG. 15C are diagrams illustrating examples of moving objects.

FIG. 15 illustrates examples of vehicles each using the abnormality detection system of a secondary battery of one embodiment of the present invention. A secondary battery module pack 8024 of a vehicle 8400 illustrated in FIG. 15A not only drives an electric motor 8406 but also can supply electric power to a light-emitting device such as a headlight 8401 or a room light (not illustrated). For the secondary battery module pack 8024 of the vehicle 8400, a plurality of cylindrical secondary batteries 616 illustrated in FIG. 16B that are interposed between a first conductive plate and a second conductive plate to form a battery pack may be used.

The plurality of secondary batteries 616 may be connected in parallel, connected in series, or connected in series after being connected in parallel. By forming a secondary battery module pack 8024 including the plurality of secondary batteries 616, large electric power can be extracted.

In order to cut off electric power from the plurality of secondary batteries, the secondary batteries in the vehicle include a service plug or a circuit breaker which can cut off a high voltage without the use of equipment. For example, in the case where 48 battery module packs which each include two to ten cells are connected in series, a service plug or a circuit breaker is placed between the 24th battery module pack and the 25th battery module pack.

Figure 15B:
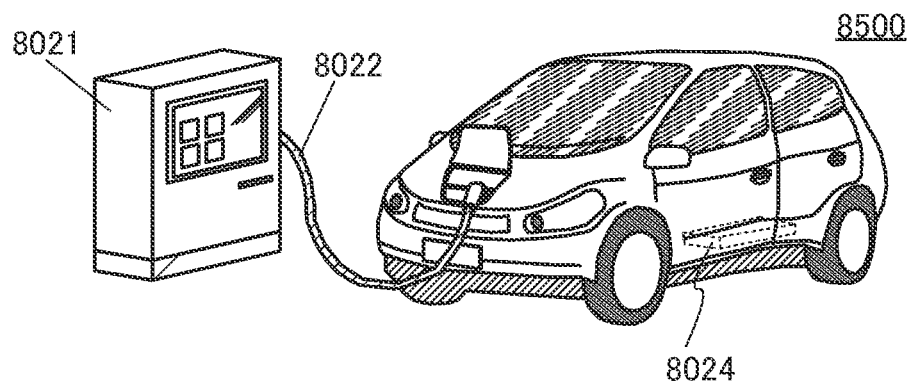

A vehicle 8500 illustrated in FIG. 15B can be charged when a secondary battery included in the vehicle 8500 is supplied with electric power from external charging equipment by a plug-in system, a contactless power feeding system, or the like. FIG. 15B illustrates a state in which the secondary battery module pack 8024 incorporated in the vehicle 8500 is charged with a ground-based charging apparatus 8021 through a cable 8022. Charging may be performed as appropriate by a given method such as CHAdeMO (registered trademark) or Combined Charging System as a charging method, the standard of a connector, or the like. The charging apparatus 8021 may be a charging station provided in a commercial facility or a power source in a house. For example, with a plug-in technique, the secondary battery module pack 8024 incorporated in the vehicle 8500 can be charged by power supply from the outside. Charging can be performed by converting AC power into DC power through a converter such as an ACDC converter.

Furthermore, although not illustrated, a power-receiving device can be incorporated in the vehicle, and the vehicle can be charged by being supplied with electric power from an above-ground power transmitting device in a contactless manner. In the case of this contactless power feeding system, by fitting a power-transmitting device in a road or an exterior wall, charging can be performed not only when the vehicle is stopped but also when driven. In addition, this contactless power feeding system may be utilized to transmit and receive electric power between vehicles. Furthermore, a solar cell may be provided in the exterior of the vehicle to charge the secondary battery while the vehicle is stopped or while the vehicle is running. For supply of electric power in such a contactless manner, an electromagnetic induction method or a magnetic resonance method can be used.

Figure 15C:
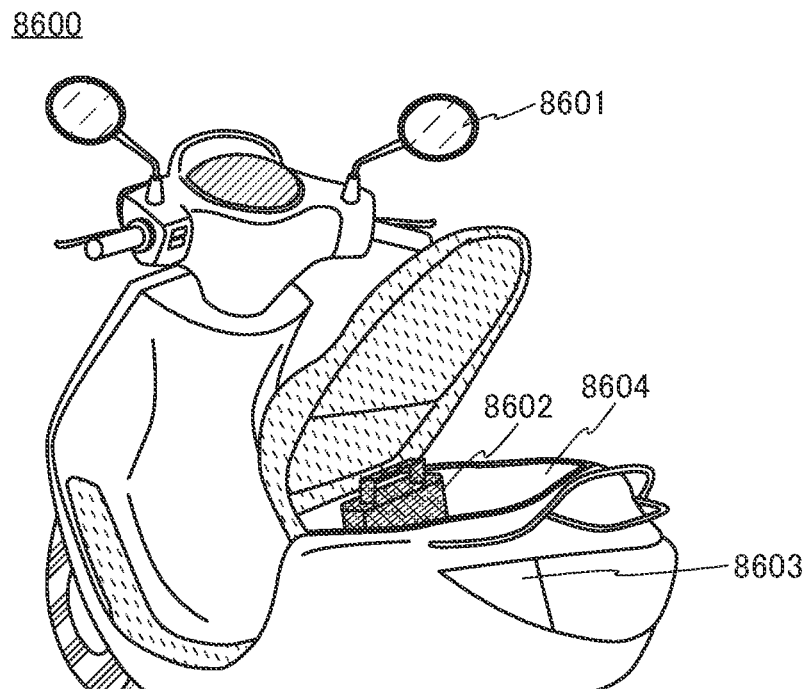

FIG. 15C illustrates an example of a motorcycle using the abnormality detection system of the secondary battery of one embodiment of the present invention. A motor scooter 8600 illustrated in FIG. 15C includes a secondary battery module pack 8602, side mirrors 8601, and direction indicators 8603. The secondary battery module pack 8602 can supply electricity to the direction indicators 8603.

In the motor scooter 8600 illustrated in FIG. 15C, the secondary battery module pack 8602 can be stored in an under-seat storage 8604. The secondary battery module pack 8602 can be stored in the under-seat storage 8604 even when the under-seat storage 8604 is small. Furthermore, this embodiment can also be applied to a power source of a snowmobile or a personal watercraft as well as a scooter.

The safety can be ensured in such a manner that a protection circuit module detects an abnormality of the secondary battery module pack 8602 early and gives a warning to a user.

This embodiment can be combined with any of the other embodiments as appropriate.

REFERENCE NUMERALS

11: protection circuit, 12: disconnecting switch, 13: protection circuit, 14: charge control circuit, 15: disconnecting switch, 16: control circuit, 17: control circuit, 18: comparison circuit, 19: AD converter, 21: protection circuit, 22: disconnecting switch, 26: control circuit, 28: comparison circuit, 30: neural network portion, 31: state estimation portion, 32: behavior estimation portion, 50: secondary battery, 51: power supply SW, 52: Noff CPU, 53: BTOS, 54: battery pack, 55: ADC, 56: ADC, 100: protection circuit, 102: comparison circuit, 103: memory, 104: memory, 105 power disconnecting switch, 106: control circuit, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 410: memory element, 420: memory element, 430: memory element, 440: memory element, 450: memory element, 460: memory element, 470: memory element, 500: transistor, 503: conductor, 503*a*: conductor, 503*b*: conductor, 510: insulator, 512: insulator, 514: insulator, 516: insulator, 518: conductor, 520: insulator, 522: insulator, 524: insulator, 526: insulator, 530: oxide, 530*a*: oxide, 530*b*: oxide, 530*c*: oxide, 530*c*1: oxide, 530*c*2: oxide, 540*a*: conductor, 540*b*: conductor, 542: conductor, 542*a*: conductor, 542*b*: conductor, 543*a*: region, 543*b*: region, 544: insulator, 546: conductor, 548: conductor, 550: insulator, 552: insulator, 560: conductor, 560*a*: conductor, 560*b*: conductor, 574: insulator, 580: insulator, 581: insulator, 582: insulator, 586: insulator, 600: capacitor, 601: positive electrode cap, 602: battery can, 603: positive electrode terminal, 604: positive electrode, 605: separator, 606: negative electrode, 607: negative electrode terminal, 608: insulating plate, 609: insulating plate, 610: conductor, 611: PTC element, 612: conductor, 616: secondary battery, 617: safety valve mechanism, 620: conductor, 630: insulator, 640: insulator, 1400: storage battery, 1402: positive electrode, 1404: negative electrode, 8021: charging device, 8022: cable, 8024: secondary battery module pack, 8400: vehicle, 8401: headlight, 8406: electric motor, 8500: vehicle, 8600: motor scooter, 8601: side mirror, 8602: secondary battery module pack, 8603: direction indicator, 8604: under-seat storage

The invention claimed is:

1. An abnormality detection system comprising:
a secondary battery;
a first module electrically connected to the secondary battery;
a detection unit electrically connected to the first module;
a first disconnecting switch electrically connected to the first module;
a second module electrically connected to the secondary battery;
a second disconnecting switch electrically connected to the second module; and a neural network portion configured to estimate at least one of deterioration state of the secondary battery and charge state of the secondary battery, wherein the abnormality detection system is configured to turn off the first disconnecting switch when the first module detects an abnormality, wherein the abnormality detection system is configured to turn off the second disconnecting switch when the second module detects an abnormality, wherein the first module includes a transistor comprising an oxide semiconductor, wherein the first module is configured to detect the abnormality by comparing estimated value and measurement value, wherein the estimated value is calculated by electric circuit model using plurality of parameters, and wherein the measurement value is measured by the detection unit.

2. The abnormality detection system according to claim 1, wherein the first module further includes CPU.

3. The abnormality detection system according to claim 1, wherein the neural network portion is electrically connected to the first module.

4. The abnormality detection system according to claim 1, wherein the neural network portion is connected to the first module by using wireless communication.

5. The abnormality detection system according to claim 1, wherein the neural network portion is configured to estimate the deterioration state of the secondary battery, and wherein the plurality of parameters used in the electric circuit model is reset on the basis of the estimated deterioration state of the secondary battery.

6. The abnormality detection system according to claim 1, wherein the neural network portion is configured to estimate the charge state of the secondary battery, and wherein the estimating the charge state of the secondary battery is calculated by using a Kalman filter.

* * * * *